(12) United States Patent
D'Evelyn et al.

(10) Patent No.: US 7,078,731 B2
(45) Date of Patent: Jul. 18, 2006

(54) GALLIUM NITRIDE CRYSTALS AND WAFERS AND METHOD OF MAKING

(75) Inventors: Mark Philip D'Evelyn, Niskayuna, NY (US); Dong-Sil Park, Niskayuna, NY (US); Steven Francis LeBoeuf, Schenectady, NY (US); Larry Burton Rowland, Scotia, NY (US); Kristi Jean Narang, Voorheeesville, NY (US); Huicong Hong, Niskayuna, NY (US); Stephen Daley Arthur, Glenville, NY (US); Peter Micah Sandvik, Clifton Park, NY (US)

(73) Assignee: General Electric Company, Niskayuna, NY (US)

(*) Notice: Subject to any disclaimer, the term of this patent is extended or adjusted under 35 U.S.C. 154(b) by 0 days.

(21) Appl. No.: 11/010,507

(22) Filed: Dec. 13, 2004

(65) Prior Publication Data

US 2005/0098095 A1 May 12, 2005

Related U.S. Application Data

(63) Continuation-in-part of application No. 10/329,981, filed on Dec. 27, 2002.

(51) Int. Cl.
*H01L 33/00* (2006.01)
(52) U.S. Cl. .......................... 257/94; 257/103
(58) Field of Classification Search ............ 257/94, 257/103
See application file for complete search history.

(56) References Cited

U.S. PATENT DOCUMENTS

| | | | |
|---|---|---|---|
| 5,637,531 A | 6/1997 | Porowski et al. | |
| 5,962,875 A | 10/1999 | Motoki et al. | |
| 6,273,948 B1 | 8/2001 | Porowski et al. | |
| 6,294,440 B1 | 9/2001 | Tsuda et al. | |
| 6,398,867 B1 | 6/2002 | D'Evelyn et al. | |
| 6,468,882 B1 | 10/2002 | Motoki et al. | |
| 6,533,874 B1 | 3/2003 | Vaudo et al. | |
| 6,596,079 B1 | 7/2003 | Vaudo et al. | |
| 6,613,143 B1 | 9/2003 | Melnik et al. | |
| 6,627,552 B1 * | 9/2003 | Nishio et al. ............... 438/694 |

(Continued)

FOREIGN PATENT DOCUMENTS

EP   0 937 790   8/1999

(Continued)

OTHER PUBLICATIONS

H. Jacobs et al., *"High-Pressure Ammonolysis in Solid-State Chemistry"*, Current Topics in Materials Science, vol. 8, edited by E. Kaldis, North-Holland Publishing Company, Chapter 5, pp. 383-427, 1982.

(Continued)

*Primary Examiner*—Long Pham
(74) *Attorney, Agent, or Firm*—Shawn A. McClintic; William E. Powell, III

(57) ABSTRACT

A GaN crystal having up to about 5 mole percent of at least one of aluminum, indium, and combinations thereof. The GaN crystal has at least one grain having a diameter greater than 2 mm, a dislocation density less than about $10^4$ cm$^{-2}$, and is substantially free of tilt boundaries.

40 Claims, 12 Drawing Sheets

U.S. PATENT DOCUMENTS

| | | | |
|---|---|---|---|
| 6,806,508 | B1 | 10/2004 | D'Evelyn et al. |
| 6,838,741 | B1 | 1/2005 | Sandvik et al. |
| 6,939,488 | B1 | 9/2005 | Blomacher et al. |
| 2002/0155634 | A1 | 10/2002 | D'Evelyn et al. |
| 2003/0141301 | A1 | 7/2003 | D'Evelyn et al. |
| 2004/0124435 | A1 | 7/2004 | D'Evelyn et al. |
| 2004/0195598 | A1 | 10/2004 | Tysoe et al. |
| 2004/0245535 | A1 | 12/2004 | D'Evelyn et al. |
| 2005/0029537 | A1 | 2/2005 | D'Evelyn et al. |
| 2005/0098844 | A1 | 5/2005 | Sandvik et al. |
| 2005/0152820 | A1 | 7/2005 | D'Evelyn et al. |
| 2005/0167692 | A1* | 8/2005 | Ishida et al. ............. 257/103 |

FOREIGN PATENT DOCUMENTS

| | | |
|---|---|---|
| EP | 0 966 047 | 12/1999 |
| EP | 1 172 464 | 1/2002 |
| EP | 1 249 522 | 10/2002 |
| FR | 2 796 657 | 1/2001 |
| JP | 11 171699 | 9/1999 |
| JP | 200022212 A | 1/2000 |
| WO | WO 96/41906 | 12/1996 |
| WO | WO 01/24921 | 4/2001 |
| WO | WO 2004/053206 | 6/2004 |
| WO | WO 2004/053208 | 6/2004 |
| WO | WO 2005/122232 | 12/2005 |

OTHER PUBLICATIONS

R. Dwilinski et al., "*GaN synthesis by Ammonothermal Method*", Acta Physical Poloncia A., vol. 88, No. 5, pp. 833-836, 1995.

R. Dwilinski et al., "*On GaN Crystallization by Ammonothermal Method*", Acta Physica Polonica A., vol. 90, No. 4, pp. 763-766, 1996.

Joseph W. Kolis et al., "*Materials Chemistry and Bulk Crystal Growth of Group III Nitrides in Supercritical Ammonia*",Mat. Res. Soc. Symp. Proc., vol. 495, pp. 367-372, 1998.

R. Dwilinski et al., Ammono Method of BN, AlN and GaN Synthesis and Crystal Growth, MRS Internet Journal Nitride Semiconductor Research 3, Article 25, pp. 1-4, 1998.

R. Dwilinski et al., Ammono Method of GaN and AlN Production,Elsevier Science, Diamond and Related Materials, vol. 7, pp. 1348-1350,1998.

J.I. Pankove et al., "*Molecular Doping of Gallium Nitride*", Applied Physics Letters, vol. 74, No. 3, pp. 416-418, 1999.

S. Porowski, "*Near Defect Free GaN Substrates*", MRS Internet Journal Nitride Semiconductor Research 4S1, Article G1.3, 1999.

T. Hino et al., "*Characterization of Threading Dislocations in GaN Epitaxial Layers*", Applied Physics Letters, vol. 76, No. 25, American Institute of Physics, pp. 3421-3423, 2000.

Douglas R. Ketchum et al., "*Crystal Growth of Gallium Nitride in Supercritical Ammonia*", Elsevier, Journal of Crystal Growth, vol. 222, pp. 431-434, 2001.

Balaji Raghothamachar et al., "*Synchrotron White Beam Topography Characterization of Physical Vapor Transport Grown AlN and Ammonothermal GaN*", Elsevier, Journal of Crystal Growth, vol. 246, pp. 271-280, 2002.

S. K. Hong et al., "*Evaluation of Nanopipes in MOCVD Grown (0001) GaN/Al$_2$O$_3$ By Wet Chemical Etching*", Elsevier, Journal of Crystal Growth, vol. 191, pp. 275-278, 1998.

R. Dwilinski et al., "Exciton Photo-Luminescence of GaN Bulk Crystals Grown by the AMMONO Method", Elsevier Science S.A., Materials Science and Engineering, vol. B50, pp. 46-49, Dec. 19, 1997.

Andrew D. Hanser et al., "Growth, Doping and Characterization of Epitaxial Thin Films and Patterned Structures of AlN, GaN, and Al$_x$Ga$_{1-x}$N", Elsevier Science S.A., Diamond and Related Materials, vol. 8, pp. 288-294, Mar. 1999.

Yu V. Melnik et al., "Structural Properties of GaN Grown on SiC Substrates by Hydride Vapor Phase Epitaxy", Elsevier Science S.A., Diamond and Related Materials, vol. 6, pp. 11532-11535, 1997.

T. Paskova et al., "Domain Structure of Thick GaN Layers Grown by Hydride Vapor Phase Epitaxy", MRS Internet J. Nitride Semicond. Res. 4S1, G3.16, 6 pages, 1999.

I. Grzegory et al., "GaN Crystals: Growth and Doping Under Pressure", Mat. Res. Soc. Symp. Proc., High Pressure Research Center Polish Academy of Sciences, Warsaw, Poland, vol. 482, pp. 15-26, 1998.

T. Suski et al., "Properties of Bulk Gallium Nitride Crystals", Electrochemical Society Proceedings, UNIPRESS, Polish Academy of Sciences, Sokolowska, Warszawa, Poland, vol. 96-11, pp. 46-57.

S. Porowski et al., "High Resistivity GaN Single Crystalline Substrates", Proceedings of the XXVI International School of Semiconducting Compounds, Jaszowiec, Warsaw, Poland, ACTA Physica Polonica A, vol. 92, No. 5, pp. 958-962, 1997.

T. Suski et al., "High Pressure Fabrication and Processing of GaN: Mg", UNIPRESS, High Pressure Research Center, Polish Academy of Sciences, Warszawa, Poland, Elsevier Science S.A., Materials Science and Engineering, vol. B59, pp. 1-5, 1999.

E. Frayssinet et al., "Evidence of Free Carrier Concentration Gradient Along the c-axis for Undoped GaN Single Crystals", UNIPRESS, High Pressure Research Center, Polish Academy of Sciences, Warszawa, Poland, Elsevier Science S.A., Journal of Crystal Growth, vol. 230, pp. 442-447, 2001.

M. Lefeld-Sosnowska et al., "Extended Defects in GaN Single Crystals", Institute of Experimental Physics, University of Warsaw, Poland, Journal of Physics D: Applied Physics, vol. 34, pp. A148-A150, 2001.

S. Krukowski, "Thermodynamics and High-Pressure Growth of (Al, Ga, In)N Single Crystals", Elsevier Science S.A., High Research Pressure Center, Polish Academy of Sciences, Sokolowska, Warsaw, Poland, Diamond and Related Materials, vol. 6, pp. 1515-1523, 1997.

M. Leszczynski et al, "The Microstructure of Gallium Nitride Monocrystals Grown at High Pressure", Elsevier Science S.A., High Pressure Research Center, Polish Academy of Sciences, Sokolowska, Warsaw, Poland, Journal of Crystal Growth, vol. 169, pp. 235-242, 1996.

M. Leszczynski et al, "Lattice Parameters of Gallium Nitride", High Pressure Research Center, Polish Academy of Sciences, Sokolowska, Warsaw, Poland, American Institute of Physics, Appl. Phys. Lett., vol. 69, No. 1, pp. 73-75, Jul. 1996.

H. Morkoc, "Comprehensive Characterization of Hydride VPE Grown GaN Layers and Templates", Elsevier Science B.V., Department of Electrical Engineering and Physics Department, Virginia Commonwealth University, Richmond, VA, Materials Science and Engineering, Reports: A Review Journal, vol. R33, pp. 135-207, 2001.

F. Yun et al., "Electrical, Structural, and Optical Characterization of Free-Standing GaN Template Grown by Hydride Vapor Phase Epitaxy", Elsevier Science Ltd., Department of Electrical Engineering and Department of Physics, Virginia Commonwealth University, Richmond, VA, Pergamon, Solid-State Electronics, vol. 44, pp. 2225-2232, 2000.

J. A. Freitas, Jr., et al., "Structural and Optical Properties of Thick Freestanding GaN Templates", Elsevier Science B.V., Journal of Crystal Growth, vol. 231, pp. 322-328, 2001.

Sung S. Park et al., "Free-Standing GaN Substrates by Hydride Vapor Phase Epitaxy", Japan Journal of Applied Physics, vol. 39, Part 2, No. 11B, pp. L1141-L1142, Nov. 15, 2000.

S. K. Mathis et al., "Modeling of Threading Dislocation Reduction in Growing GaN Layers", Phys. Stat. Sol. vol. (a) 179, pp. 125-145, 2000.

Yoshinobu Ono et al., "Reduction of Etch Pit Density on GaN by InGaN-Strained SQW", Elsevier Science B.V., Journal of Crystal Growth, vols. 189/190, pp. 133-137, 1998.

P. Visconti et al., "Investigation of Defects and Polarity in GaN Using Hot Wet Etching, Atomic Force and Tranmission Electron Microscopy and Convergent Beam Electron Diffraction", Phys. Stat.Sol. vol. (b) 228, No. 2, pp. 513-517, 2001.

P. Viscontie et al., "Dislocation Density in GaN Determined by Photoelectrochemical and Hot-Wet Etching", American Institute of Physics, Applied Physics Letters, vol. 77, No. 22, pp. 3532-3534, 2000.

Xueping Xu et al., "Growth and Characterization of Low Defect GaN by Hydride Vapor Phase Epitaxy", Elsevier Science V.B., Journal of Crystal Growth, vol. 246, pp. 223-229, 2002.

R. P. Vaudo et al., "GaN Boule Growth: A Pathway to GaN Wafers With Improved Material Quality", Phys. Stat. Sol., vol. (a) 194, No. 2, pp. 494-497, 2002.

D. Hanser et al., "Growth and Fabrication of 2 Inch Free-Standing GaN Substrates via the Boule Growth Method", Mat. Res. Soc. Symp. Proc., vol. 798, pp. Y2.1.1-Y.2.1.6, 2004.

V. Dmitriev et al., "Properties of GaN Homoepitaxial Layers Grown on GaN Epitaxial Wafers", Mat. Res. Soc. Symp. Proc., vol. 512, pp. 451-456, 1998.

Richard J. Molnar, "Hydride Vapor Phase Epitaxial Growth of III-V Nitrides", Galliumn Nitride, (GaN) II, Semiconductors and Semimetals, vol. 57, pp. 1-31, 1999.

Masashi Hasegawa et al., "Growth of Nitride Crystals in a Supercritical Nitrogen Fluid Under High Pressures and High Temperatures Yield Using Diamond Anvil Cell and YAG Laser Heating", Elsevier Science B.V., Journal of Crystal Growth 217, pp. 349-354, 2000.

K. Byrappa et al., "A Technology for Crystal Growth and Materials Processing", Handbook of Hydrothermal Technology, University of Mysore Manasagangotri, Mysore, India, Apparatus, pp. 82-160, 2001.

Pedro Gomez-Romero, "Hybrid Organic-Inorganic Materials—In Search of Synergic Activity", Advanced Materials, vol. 13, No. 3, pp. 163-174, Feb. 5, 2001.

Guido Kickelbick et al., "Inorganice Clusters in Organic Polymers and the Use of Polyfunctional Inorganic Compounds as Polymerization Initiators", Monatshefte für Chemie, vol. 132, pp. 13-30, 2001.

Helmut K. Schmidt, "Synthesis and Application of Inorganic/Organic Composite Materials", Macromol. Symp., vol. 101, pp. 333-342, 1996.Jeffrey Pyun et al., "Synthesis of Nanocomposite Organic/Inorganic Hybrid Materials Using Controlled/"Living" Radical Polymerization", American Chemical Society, Chem. Mater., vol. 13, pp. 3436-3448, 2001.

S. Porowski et al., "GaN Crystals Grown in the Increased Volume High Pressure Reactors", Mat. Res. Soc. Symp. Proc., vol. 449, High Pressure Research Center Polish Academy of Sciences, Warsaw, Poland, pp. 35-40, 1997.

Jeffrey Pyun et al., "Synthesis of Nanocomposite Organic/Inorganic Hybrid Materials Using Controlled/"Living"Radical Polymerization", American Chemical Society, Chem. Mater., vol. 13, pp. 3436-3448, 2001.

Abandoned U.S. Appl. No. 09/694,690, filed on Oct. 23, 2003, GE entitled "Homoepitaxial Callium-Nitride-Based Light Emitting Device and Method for Producing".

Co-Pending U.S. Appl. No. 09/683,658, filed on Jan. 31, 2002, GE entitled "Improved Pressure Vessel".

* cited by examiner

Use Figure 3 from 1305751-1

GALLIUM NITRIDE CRYSTALS AND WAFERS AND METHOD OF MAKING

CROSS REFERENCE TO RELATED APPLICATION

This application is a continuation-in-part of application Ser. No. 10/329,981, filed Dec. 27, 2002, and claims benefit therefrom.

STATEMENT REGARDING FEDERALLY SPONSORED RESEARCH & DEVELOPMENT

The United States Government may have certain rights in this invention pursuant to Cooperative Agreement No. 70NANB9H3020, awarded by the National Institute of Standards and Technology, United States Department of Commerce.

BACKGROUND OF THE INVENTION

This invention is related generally to a high quality gallium nitride single crystal and a method of making the same.

FIELD OF THE INVENTION

Gallium nitride (GaN) based optoelectronic and electronic devices are of tremendous commercial importance. However, the quality and reliability of these devices is compromised by very high defect levels, particularly threading dislocations in semiconductor layers of the devices. These dislocations can arise from lattice mismatch of GaN based semiconductor layers to a non-GaN substrate such as sapphire or silicon carbide. Additional defects can arise from thermal expansion mismatch, impurities, and tilt boundaries, depending on the details of the growth method of the layers.

The presence of defects has a deleterious effect on epitaxially-grown layers, compromising electronic device performance and reliability and requiring complex, tedious fabrication steps to reduce the concentration and/or impact of the defects. While a substantial number of growth methods for gallium nitride crystals have been proposed, the methods to date still merit improvement.

U.S. Pat. Nos. 5,637,531 and 6,273,948 disclose methods for growing gallium nitride crystals at high pressure and high temperature, using liquid gallium and gallium-based alloys as a solvent and a high pressure of nitrogen above the melt to maintain GaN as a thermodynamically-stable phase. The process is capable of growing electrically-conductive GaN crystals with a dislocation density of about $10^3$–$10^5$ cm$^{-2}$ or, alternatively, semi-insulating GaN crystals with a dislocation density of about 10–$10^4$ cm$^{-2}$, as described by Porowski, "Near defect-free GaN substrates" [MRS Internet J. Nitride Semicond. Research 4S1, G1.3 (1999)].

The conductive crystals, however, have a high concentration of n-type defects, on the order of $5 \times 10^{19}$ cm$^{-3}$. These defects are believed to comprise oxygen impurities and nitrogen vacancies. As a consequence, the crystals are relatively opaque, with an absorption coefficient of about 200 cm$^{-1}$ at wavelengths in the visible portion of the spectrum. As a consequence, up to half the light emitted by a light emitting diode (LED) fabricated on such a crystal is absorbed by the substrate. This constitutes a large disadvantage compared to conventional heteroepitaxial LEDs fabricated on sapphire or transparent SiC substrates. Further, the high concentration of n-type defects in nominally undoped crystals grown in molten Ga causes the lattice constant to increase by about 0.01–0.02%, generating lattice mismatch and leading to strain in undoped epitaxial GaN layers deposited thereupon. Additionally, the undoped GaN substrates formed by this method have a rather low carrier mobility, about 30–90 cm$^2$/V-s, which may adversely impact performance in high-power devices.

The transparency and dislocation density of GaN crystals grown in liquid Ga may be improved by the addition of Mg or Be to the growth medium, but the crystals so produced are semi-insulating, with a resistivity above about $10^5$ Ω-cm. Such crystals are not appropriate for vertical devices in which one electrical contact is made to the substrate itself. These substrates have several additional disadvantages, including: (i) a high concentration of Mg and O atoms, approximately $10^{19}$ cm$^{-3}$ each [J. I. Pankove et al., Appl. Phys. Lett. 74, 416 (1999)], which could potentially diffuse into device structures during high temperature processing; and (ii) relatively poor thermal conductivity. Dopants may diffuse into the undoped GaN buffer layer in a high electron mobility transistor (HEMT), for example, in which transport by the two-dimensional electron gas is designed to occur, degrading carrier mobility. In addition, the presence of the point defects scatters phonons in the bulk GaN substrate and degrades thermal conductivity, which is detrimental to achieving theoretical performance levels in GaN-based HEMTs.

A final but very important limitation of the method of Porowski and co-workers is that it does not appear to be scalable, that is, capable of producing GaN boules and wafers with diameters of 50 mm and above. The process typically yields a number of platelet crystals, with a diameter of about 10 mm and a thickness of 0.1–0.2 mm; prolonged growth does not produce larger crystals of comparable quality. The largest crystal grown to date by this method is about 20 mm in diameter. Because the process yields platelets rather than thick boules, the economies of scale associated with conventional wafering technology (slicing, polishing) cannot be achieved and the substrates will remain extremely expensive.

The most mature technology for growth of pseudo-bulk or bulk GaN is hydride/halide vapor phase epitaxy, also known as HVPE. In the most-widely applied approach, HCl reacts with liquid Ga to form vapor-phase GaCl, which is transported to a substrate where it reacts with injected $NH_3$ to form GaN. Typically the deposition is performed on a non-GaN substrate such as sapphire, silicon, gallium arsenide, or $LiGaO_2$. The dislocation density in HVPE-grown films is initially quite high, on the order of $10^{10}$ cm$^{-2}$ as is typical for heteroepitaxy of GaN, but drops to a value of about $10^7$ cm$^{-2}$ after a thickness of 100–300 μm of GaN has been grown. For example, Vaudo et al. [U.S. Pat. No. 6,596,079] teach a method for fabricating GaN wafers or boules with a dislocation density below $10^7$ cm$^{-2}$.

HVPE may be capable of reducing defect levels further in thicker films, but values below $10^4$ cm$^{-2}$ over an entire wafer seem unlikely. It is well established that the dislocation density of GaN grown on a non-GaN substrate (or on a GaN substrate that was itself grown on a non-GaN substrate) decreases as the GaN layer becomes thicker. Even if GaN wafers are sliced from a thick HVPE-grown boule and used as a seed for additional growth, the residual dislocations and grain or tilt boundaries are expected to persist indefinitely. Vaudo et al. [Phys. Stat. Solidi(a) 194, 494 (2002)] reported a dislocation density below $10^4$ cm$^{-2}$ within a grain of a thick HVPE film; however, the dislocation density between grains, most likely comprising predominantly edge dislocations, is expected to be much higher. In addition, strain is present in HVPE wafers due to the thermal expansion mismatch between substrate and film. This strain produces bowing upon cool down of the substrate and film after growth. At least a portion of the strain and bowing remain even after removal of the original substrate. Threading dislocations, strain, and bowing that are present in the substrate are expected to also be present in epitaxial layers deposited on such substrates to form optoelectronic or electronic devices.

Melnik et al. [U.S. Pat. No. 6,613,143] disclose a HVPE growth method for GaN on SiC substrates. These inventors report that the defect density was measured using wet chemical etching in hot acid. Melnik et al. report etch pit densities of $10–100$ $cm^{-2}$ for wafers sliced from a 1-cm-thick boule and of $10–1000$ or $100–10,000$ $cm^{-2}$ for wafers sliced from boules that were 5, 7, or 9 mm thick. It is very likely that the etch pit densities reported by Melnik et al. in fact greatly underestimate the dislocation density in these materials. The growth method of Melnik et al. is distinct in some details (e.g., the use of a SiC substrate) but is overall very similar to the methods employed by a number of other groups. Based on FIG. 9, for a GaN layer about 5 to 10 mm thick, a dislocation density in the range of $10^5–10^6$ $cm^{-2}$ would be expected, in contrast to the EPD values of $10–10,000$ $cm^{-2}$ reported by Melnik et al. While a discrepancy by a factor of 10 from the data in FIG. 1 may be within observed variation from experiment to experiment and from group to group, a factor of $10^4$ (10 versus $10^5$ $cm^{-2}$) is not at all credible. It is also well established that etch pit densities in GaN can grossly underestimate dislocation densities, particularly when measured using acid treatments of the type employed by Melnik, for example, by a factor of 10 or more.

In addition, thick films, of the type grown by Vaudo et al. and by Melnik et al. by HVPE, will contain tilt boundaries despite the use of a single seed. Such behavior in thick GaN films grown by HVPE has been reported by many authors. Tilt boundaries will persist throughout an entire GaN ingot, regardless of its thickness. The same is true for GaN grown on a GaN seed containing tilt boundaries, for example, because it originated from a heteroepitaxial film on a substrate such as SiC or sapphire.

Other widely-applied methods for growth of large area, low-dislocation-density GaN are variously referred to as epitaxial lateral overgrowth (ELO or ELOG), lateral epitaxial overgrowth (LEO), selective area growth (SAG), dislocation elimination by epitaxial growth with inverse pyramidal pits (DEEP), or the like. In the case of all variations of this method, heteroepitaxial GaN growth is initiated in a one- or two-dimensional array of locations on a substrate, where the locations are separated by a mask, trenches, or the like. The period or pitch of the growth locations is between 3 and 100 μm, typically between about 10 and 20 μm. The individual GaN crystallites grow and then coalesce. Epitaxial growth is then continued on top of the coalesced GaN material to produce a thick film or "ingot." Typically, the thick GaN layer formed on the coalesced GaN material is deposited by HVPE.

The ELO process is capable of large reductions in the concentration of dislocations, particularly in the regions above the mask, typically to levels of about $10^5–10^7$ $cm^{-2}$. However, many types of devices fabricated on ELO substrates will have a surface area of at least about $10^4$ $\mu m^2$ ($10^{-4}$ $cm^2$) and still contain a substantial number of threading dislocations. In addition, an ELO GaN substrate is not a true single crystal although a number of authors do refer to ELO structures as single crystals. Each individual GaN crystallite constitutes a grain, and there is typically a low-angle grain boundary or a tilt boundary at the points where the grains coalesce. The low-angle or tilt boundaries are manifested as an array of edge dislocations, and generate lateral strain within the GaN. The extent and severity of the crystallographic tilting depends on the details of the masking and growth conditions, but there is generally at least a low level of tilting associated with grain coalescence. Much or most of the crystallographic tilting forms directly during growth, rather than simply being a consequence of thermal expansion mismatch. The separation between the tilt boundaries is equal to the period or pitch of the original mask, or typically about 10–20 μm. The tilt boundaries will persist indefinitely through epitaxial layers grown on such a substrate. The consequence is that devices formed on such substrates will also have tilt boundaries running through them if the devices have lateral dimensions larger than about 100 μm, and particularly if they have lateral dimensions larger than about 300 μm, and even more so if they have lateral dimensions larger than about 2000 μm.

Residual stress or strain in homoepitaxial GaN-based devices resulting, for example, from the presence of tilt boundaries, may accelerate the degradation of laser diodes, high-power light emitting diodes, high power transistors, or other devices. Similarly, dislocations associated with tilt boundaries may reduce the lifetime of high-power light emitting diodes, laser diodes, and power electronic devices. An example of such behavior, showing the dependence of laser diode lifetime on dislocation density, is shown in FIG. 12. Degradation of device lifetimes by dislocations may result from facilitating impurity diffusion into the active layer or from facile generation of new dislocations. Dislocations may act as non-radiative recombination centers, degrading the light emission efficiency of light emitting diodes and laser diodes. Dislocations may also increase reverse-bias current leakage, degrading the performance of diodes, transistors, and photodetectors. Clearly, the presence of even a single dislocation within a GaN-based device can degrade its performance and/or lifetime.

The tilt-grain-boundary structure and lateral strain persists throughout an entire ingot and therefore into each substrate sliced from this ingot. In other words, no substrate sliced from such an ingot will be a true single crystal, free of tilt boundaries and lateral strain. In addition, the GaN substrate is likely to suffer from the same deficiencies in UV absorption and photoluminescence at room temperature as "standard" HVPE GaN.

Other methods for crystal growth of GaN involve the use of supercritical ammonia as a solvent. Several groups have reported growth of very small GaN crystals in supercritical ammonia, notably Kolis et al. in "Materials Chemistry and Bulk Crystal Growth of Group III Nitrides in Supercritical Ammonia", Mater. Res. Soc. Symp. Proc. 495, 367 (1998)]; "Crystal Growth of Gallium Nitride in Supercritical Ammonia", J. Cryst. Growth 222, 431 (2001); "Synchrotron white beam topography characterization of physical vapor transport grown AlN and ammonothermal GaN", J. Cryst. Growth 246, 271 (2002); and Dwilinski et al. in "AMMONO Method of GaN and AlN Production", Diamond Relat. Mater. 7, 1348 (1998); "AMMONO Method of BN, AlN, and GaN Synthesis and Crystal Growth", MRS Internet J. Nitride Semiconductor Res. 3, article 25 (1997); "On GaN Crystallization by Ammonothermal Method" Acta Phys. Pol. A 90, 763 (1996); and "GaN Synthesis by Ammonothermal Method" Acta Phys. Polonica A 88, 833 (1995)]. These methods generally use ammonobasic chemistry, with the addition of a mineralizer chosen from at least one of A, ANH$_2$, or AX, where A is an alkali atom and X is a halide. In the presence of NH$_3$, alkali atoms A will generally react to form ANH$_2$+½H$_2$ and are therefore also considered basic. However, only small crystals or mm-sized crystals of rather poor quality, with a dislocation density above about 10$^6$ cm$^{-2}$, have been reported to date. In addition, these authors do not disclose the use of temperature gradient profiles to optimize growth on seeds.

More recently, Dwilinski et al. [U.S. Pat. No. 6,656,615 and PCT application WO 03/035945] disclose an improved ammonobasic method for growing GaN involving the use of compound temperature gradient profiles. These inventors teach a dislocation density in the range of 10$^4$–10$^8$ cm$^{-2}$ or less, but present only a single example, claiming a dislocation density of 6×10$^4$ cm$^{-2}$ in a layer about 200–300 μm thick above an HVPE seed. Based on published accounts of dislocation density as a function of layer thickness in HVPE GaN, this value seems unrealistically low, perhaps due to undercounting resulting from difficulty in resolving adjacent dark spots in cathodoluminescence images. In addition, Dwilinski et al. present no teaching on the elimination of tilt boundaries from GaN crystals. Tilt boundaries will certainly be present in GaN crystals grown by their method because of their use of HVPE seeds, which inevitably contain tilt boundaries. Dwilinski et al. teach the addition of gallium or alkali metal to the reactor. Such additions will produce hydrogen by chemical reaction with ammonia, which is undesirable because hydrogen tends to embrittle the walls of the pressure vessel and is not an effective solvent for GaN. These inventors teach the use of pressures as high as 10 kbar but no effective way of achieving them, since the autoclaves disclosed as pressure vessels can safely reach a maximum pressure of only 5 kbar. An additional limitation of the method of Dwilinski et al. is that growth rates are quite small, ca. 0.2–3 μm/hr. These rates are comparable to those achieved by conventional MOCVD, and raise serious questions about the economic viability of the method.

French patent FR 2,796,657 to Demazeau et al. discloses a method for GaN growth in supercritical ammonia or hydrazine at pressures of 0.05–20 kbar, temperatures of 100–600° C., and a temperature gradient of 10–100° C. The only apparatus taught by Demazeau to access these conditions is a Tuttle-type cold-seal pressure vessel, which is well known in the art and is limited to a maximum pressure of 5–6 kbar. Standard pressure vessels are limited to a pressure of about 5–6 kbar when working with NH$_3$, as discussed by Jacobs and Schmidt in "High Pressure Ammonolysis in Solid-State Chemistry", *Curr. Topics Mater. Sci.* 8, ed. by E Kaldis (North-Holland, 1982)], limiting the maximum temperature, reaction rate, and, in all likelihood, crystalline quality. Therefore, Demazeau discloses no method capable of reaching the higher pressure range, and does not demonstrate GaN crystals larger than 1 mm in size. In addition, Demazeau does not teach the use of temperature gradient profiles to optimize growth on seeds.

Purdy [U.S. Pat. Nos. 6,177,057 and 2003/0209191 and Cryst. Growth Design 2, 141 (2002)] and Chen [Mater. Res. Bull. 36, 2155 (2001)] teach the use of the acid mineralizers NH$_4$Cl, NH$_4$Br, and NH$_4$I, at concentrations of 1–5 mole percent in ammonia, for GaN growth. Both sets of authors focus mainly on cubic (zincblende) GaN rather than hexagonal (wurtzite) GaN. However, the latter is obtained at higher temperatures. Purdy teaches away from the use of NH$_4$F as a mineralizer, citing its low solubility in liquid NH$_3$ and irreversible formation of GaF$_3$. Indeed, Kolis [Mater. Res. Soc. Symp. Proc. 495, 367 (1998)] reports apparently-irreversible formation of an unidentified complex when using NH$_4$F as a mineralizer, and did not observe any GaN growth.

U.S. Pat. No. 6,398,867 to D'Evelyn et al. discloses a method for temperature gradient recrystallization of GaN in a supercritical fluid at a pressure greater than 5 kbar, a temperature greater than 550° C., with a temperature gradient of 5–300° C. These authors do not teach the use of temperature gradient profiles to optimize growth on seeds, nor the demonstration of dislocation densities below 10$^4$ cm$^{-2}$.

Gallium nitride grown by all known methods contains native defects that may degrade the properties of the crystal and of devices grown thereupon. One commonly occurring native defect is the Ga vacancy which, in n-type GaN, acts as a deep, triple acceptor that compensates donors. In principle, hydrogen can bind to gallium vacancies, capping the dangling bond on 1–4 surrounding N atoms to form N—H bonds, denoted V$_{Ga}$H, V$_{Ga}$H$_2$, V$_{Ga}$H$_3$, and V$_{Ga}$H$_4$. N—H bonds associated with Ga vacancies are predicted [C. Van de Walle, Phys. Rev. B 56, R10020 (1997)] to have vibration frequencies between 3100 and 3500 cm$^{-1}$ and to be quite stable. However, known GaN crystal growth methods do not provide a means for passivating Ga vacancies by hydrogenation. For example, infrared transmission spectroscopy on 300–400 μm thick GaN samples grown by HVPE revealed weak absorption features near 2850 and 2915 cm$^{-1}$ associated with another defect, but no absorption features between 3100 and 3500 cm$^{-1}$ that could be assigned to hydrogenated Ga vacancies were observed.

Doping of GaN by rare earth metals is known to produce luminescence. For example, Lozykowski et al. [U.S. Pat. No. 6,140,669] teach the incorporation rare earth ions into GaN layers by ion implantation, MOCVD, or MBE, and annealing at 1000° C. or greater. Birkhahn et al. [U.S. Pat. No. 6,255,669] teach the fabrication of light-emitting diodes using GaN layers doped with a rare earth ion or with chromium. However, these inventions focus on thin GaN epitaxial layers rather than bulk crystals. Growth of luminescent, bulk GaN or homoepitaxial GaN that is substantially free of tilt boundaries, with a dislocation density of less than 10$^4$ or 100 cm$^{-2}$, is as yet unknown in the art.

SUMMARY OF THE INVENTION

In accordance with one aspect of the present invention, there is provided a GaN single crystal at least about 2 millimeters in diameter, with a dislocation density of less than about 10$^4$ cm$^{-1}$, and having substantially no tilt boundaries.

In accordance with another aspect of the present invention, there is provided a GaN single crystal at least about 2 millimeters in diameter, and having no tilt boundaries, wherein the single crystal has a photoluminescence spectrum which peaks at a photon energy of between about 3.38 and about 3.41 eV at a crystal temperature of 300° K.

In accordance with another aspect of the present invention, there is provided a method of forming a GaN single crystal. The method comprises (a) providing a nucleation center in a first region of a chamber; (b) providing a GaN source material in a second region of the chamber; (c) providing a GaN solvent in the chamber; (d) pressurizing the chamber; (e) generating and holding a first temperature distribution such that the solvent is supersaturated in the first region of the chamber and such that there is a first temperature gradient between the nucleation center and the GaN source material such that GaN crystal grows on the nucleation center; and (f) generating a second temperature distribution in the chamber such that the solvent is supersaturated in the first region of the chamber and such that there is a second temperature gradient between the nucleation center and the GaN source material such that GaN crystal grows on the nucleation center, wherein the second temperature gradient is larger in magnitude than the first temperature gradient and the crystal growth rate is greater for the second temperature distribution than for the first temperature distribution.

In accordance with another aspect of the present invention, there is provided a method of forming a GaN single crystal. The method comprises (a) providing a nucleation center in a first region of a chamber having a first end; (b) providing a GaN source material in a second region of the chamber having a second end; (c) providing a GaN solvent in the chamber; (d) pressurizing the chamber to a pressure of between 5 and 80 kbar; (e) generating and holding a first temperature distribution having an average temperature between about 550° C. and about 1200° C. such that the solvent is supersaturated in the first region of the chamber and such that there is a first temperature gradient between the first end and the second end such that GaN crystal grows on the nucleation center; and (f) generating a second temperature distribution in the chamber having an average temperature between about 550° C. and about 1200° C. such that the solvent is supersaturated in the first region of the chamber and such that there is a second temperature gradient between the first end and the second end such that GaN crystal grows on the nucleation center, wherein the second temperature gradient is larger in magnitude than the first temperature gradient and the crystal growth rate is greater for the second temperature distribution than for the first temperature distribution.

In accordance with another aspect of the present invention, there is provided a method of forming a GaN single crystal. The method comprises (a) providing a nucleation center in a first region of a chamber having a first end; (b) providing a GaN source material in a second region of the chamber having a second end; (c) providing a GaN solvent in the chamber; (d) pressurizing the chamber; (e) generating and holding a first temperature distribution such that there is a first temperature gradient between the first end and the second end; and (f) generating a second temperature distribution in the chamber such that the solvent is supersaturated in the first region of the chamber and such that there is a second temperature gradient between the first end and the second end such that GaN crystal grows on the nucleation center, wherein the first temperature gradient is zero or opposite in sign from the second temperature gradient.

DETAILED DESCRIPTION OF THE PREFERRED EMBODIMENTS

Figure 1:
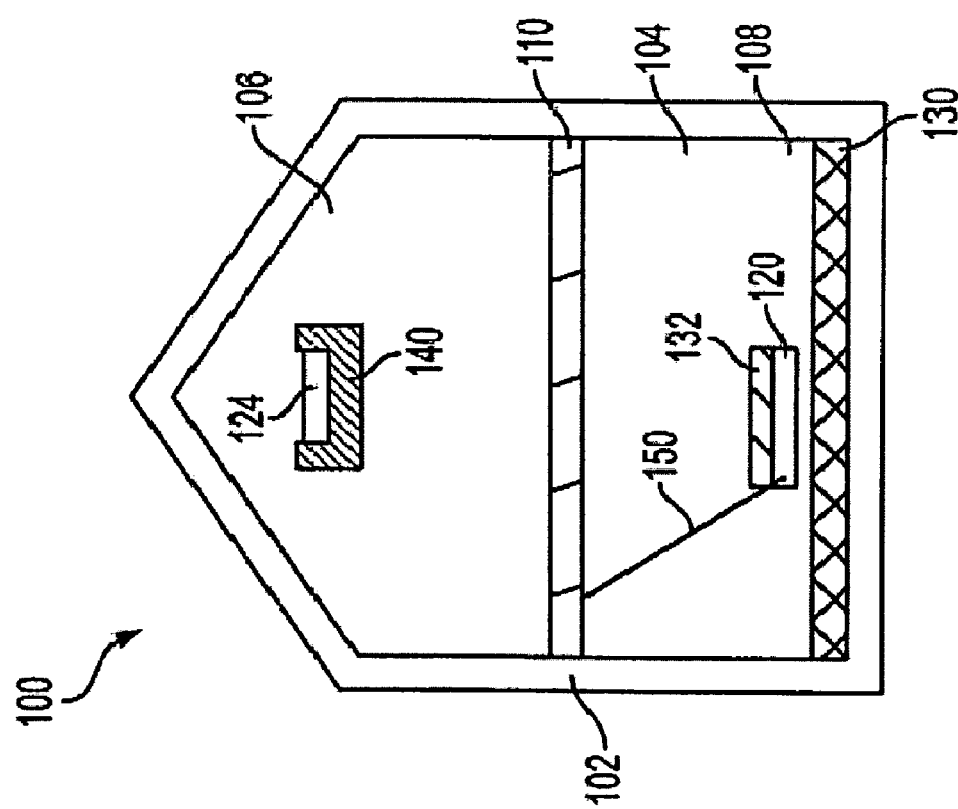
FIG. 1 is a schematic cross-sectional representation of a capsule used for making a GaN single crystal according to a preferred embodiment of the invention.

Reference will now be made in detail to presently preferred embodiments of the present invention. Wherever possible, the same reference numbers will be used throughout the drawings to refer to the same or like parts.

The present inventors have found that GaN nucleates very readily in supercritical ammonia and other supercritical GaN solvents so that recrystallization produces many small crystals rather than one large crystal. While small high quality GaN crystals could be grown by the methods known in the prior art, no high quality crystal larger than 2 mm with a dislocation density below $10^4$ cm$^{-2}$ has been grown by these methods. The present inventors have found that a method using an improved temperature profile including appropriate temperature gradients, together with an improved method for mounting seed crystals, is capable of overcoming these limitations.

According to embodiments of the present invention, a true single crystal that is substantially free of grain and tilt boundaries, may be synthesized, and grown from a single nucleus to a size of at least 2 mm in diameter. The single crystal may be n-type, electrically conductive, optically transparent, free of lateral strain and tilt boundaries, and with a dislocation density of less than about $10^4$ cm$^{-2}$ Preferably, the dislocation density is less than about $10^3$ cm$^{-2}$ In another embodiment, the dislocation density is less than about 100 cm$^{-2}$. In one embodiment, the single crystal is p-type; in another, it is semi-insulating. In another embodiment, the single crystal is magnetic; in yet another, it is luminescent; in still another, it is optically absorbing or black. In one embodiment, the crystal contains hydrogen in a form that results in an infrared absorption peak near 3175 cm$^{-1}$, with an absorbance per unit thickness greater than about 0.01 cm$^{-1}$. In another embodiment, the substrate contains greater than about 0.04 ppm fluorine, and typically between about 0.04 and 1 ppm fluorine. In one embodiment, the crystal is doped with at least one of Be, C, O, Mg, Si, H, Ca, Sc, Ti, V, Cr, Mn, Fe, Co, Ni, Cu, Zn, Ge, Zr, Hf, or a rare earth metal at a concentration between about $10^{16}$ cm$^{-3}$ and about $10^{21}$ cm$^{-3}$. In addition, the gallium nitride crystal may contain up to 5 mole percent Al or In.

This large high quality gallium nitride single crystal may be grown by temperature gradient recrystallization at high pressure and high temperature in a superheated fluid solvent. The crystal is a true single crystal, i.e., it does not have tilt boundaries.

These gallium nitride crystals may be grown by temperature-gradient recrystallization in a superheated fluid, including but not limited to ammonia, hydrazine, methylamine, ethylenediamine, melamine, or other nitrogen-containing fluid. The source material may comprise single crystal or polycrystalline GaN. The single crystal or polycrystalline GaN for the source material may be grown by any number of methods known in the art. Other forms of source material may also be used, for example, amorphous GaN or a GaN precursor such as Ga metal or a Ga compound. It is preferred that the source GaN comprise one or more particles that are sufficiently large in size so as not to pass through the openings in a baffle, described below, that separates the source region, where the source material is located, from the crystal growth region, where a nucleation center is located, of a chamber or capsule, as discussed in more detail below.

Nucleation for GaN growth may be induced on the crystal growth portion of the capsule at a nucleation center without a seed crystal, such as a portion of the container wall, or with a non-GaN seed crystal such as sapphire, for example. It is preferred, however, that a GaN seed crystal is provided, because the process is easier to control and the quality of the grown crystal is higher.

The seed crystal is preferably larger than 1 mm in diameter and of high quality, free of tilt boundaries and having a dislocation density less of than about $10^8$ cm$^{-2}$, and preferably below about $10^5$ cm$^{-2}$. A variety of types of GaN seed crystals may be provided, including an epitaxial GaN layer on a non-GaN substrate such as sapphire or SiC, a free-standing GaN film grown by HVPE, sublimation, or metal organic chemical vapor deposition (MOCVD), or a crystal grown in a superheated fluid in a previous run.

The seed may have any crystallographic orientation, as growth occurs on all exposed GaN surfaces. GaN crystals grown from seeds are typically terminated predominantly by (0001), (000$\bar{1}$), and (1$\bar{1}$00) facets, and all these orientations are suitable for seed surfaces. The (11$\bar{2}$0) surfaces are typically fast growing in the inventive method, and also constitute favorable seed surface orientations. In one embodiment, the crystallographic orientation of the GaN crystals that are grown are within about 10° of one of the (0001) orientation, the (000$\bar{1}$) orientation, the (10$\bar{1}$0) orientation, the (11$\bar{2}$0) orientation, and the (10$\bar{1}$1) orientation. In another embodiment, the orientation of the grown GaN crystals is within about 5° of one of these orientations. A standard metric for the crystallinity of as-grown GaN crystals or of GaN wafers is provided by x-ray diffraction rocking curve measurements of the (0002) reflection. The full width at half maximum (FWHM) of the (0002) diffraction intensity versus ω of GaN crystals and wafers of the inventive method will typically be less than 50 arc-seconds.

In a preferred embodiment, the GaN seed crystals have a dislocation density below $10^4$ cm$^{-2}$ and are substantially free of tilt boundaries (also known as low-angle grain boundaries), resulting in GaN crystals that similarly have a dislocation density below about $10^4$ cm$^{-2}$ and are substantially free of tilt boundaries. In another embodiment, the GaN seed crystals contain one or more tilt boundaries. For example, GaN crystals grown by HVPE may be employed as seed crystals. Such an approach offers a convenient path to large-area seed crystals. However, GaN crystals grown by HVPE typically have a dislocation density in the range of $10^5$–$10^8$ cm$^{-2}$. In addition, heteroepitaxy produces mosaic structures and, as the thickness of the heteroepitaxial film increases, for example, above 1 mm, the presence of tilt boundaries in the thick film becomes increasingly apparent. A bulk GaN crystal grown according to the present invention on a seed with tilt boundaries will also contain tilt boundaries.

Figure 4:
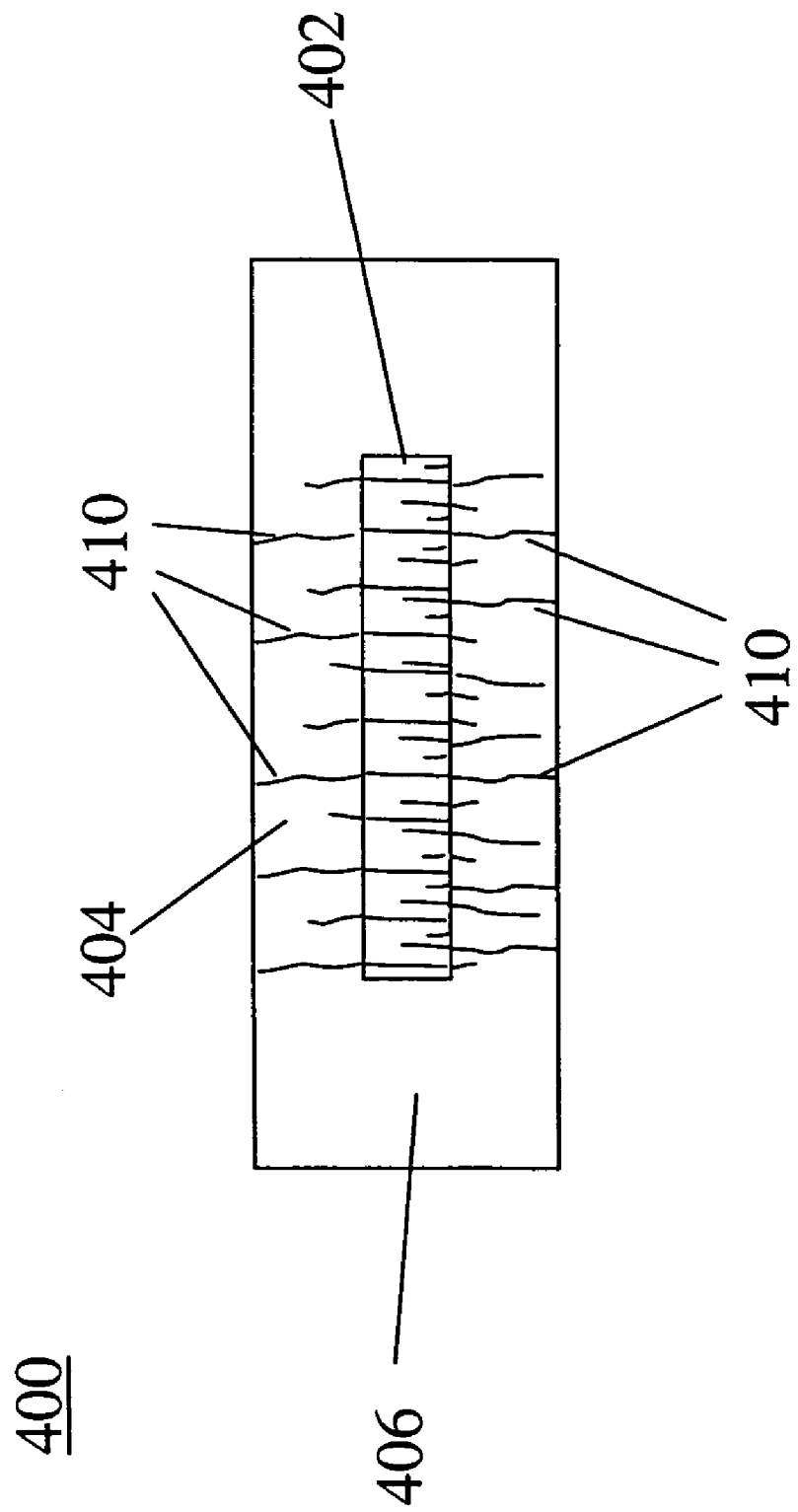
FIG. 4 is a schematic illustration of the evolution of dislocations in bulk GaN grown on a c-oriented seed crystal containing dislocations.
Figure 5:
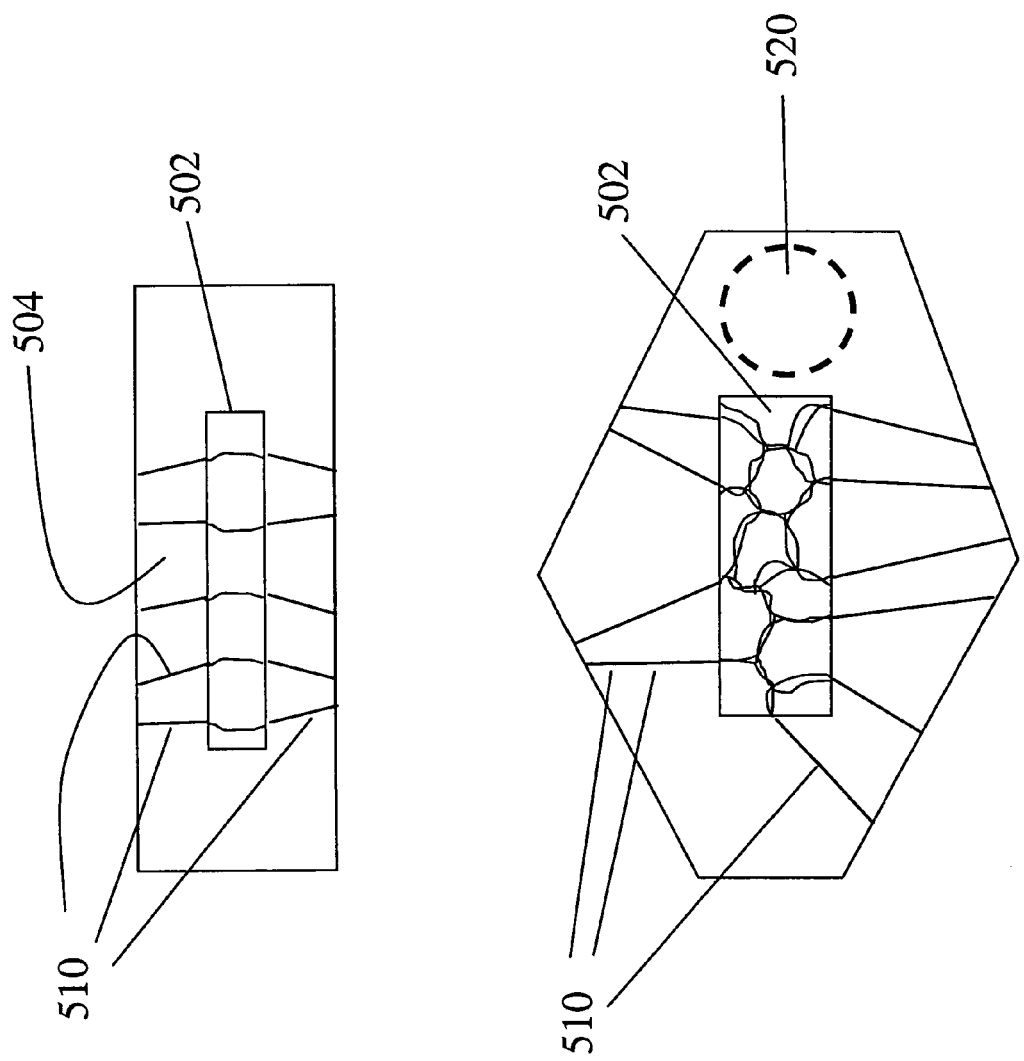
FIG. 5 is a schematic illustration of the evolution of tilt boundaries in bulk GaN grown on a c-oriented seed crystal containing tilt boundaries.

GaN crystals with a dislocation density below about $10^4$ cm$^{-2}$ that are substantially free from tilt boundaries may be grown from seed crystals with a dislocation density of about $10^5$–$10^8$ cm$^{-2}$ and tilt boundaries by the following procedure. By suitable control of the solvent fill, mineralizer concentration, temperature, and temperature gradient, growth on the seed will occur in both the c direction (that is, (0001) and (000$\bar{1}$), along the c-axis) and perpendicular to the c direction. The dislocation density 410 in bulk GaN grown in the c-direction is reduced significantly. For example, growth of a 300–800 μm thick layer above a c-oriented seed crystal 402 containing approximately $10^7$ dislocations cm$^{-2}$ results in a GaN crystal with approximately 1–3×$10^6$ dislocations cm$^{-2}$ in the region above the seed 404, as shown in FIG. 4. However, the bulk GaN grown laterally 406 with respect to a c-oriented seed crystal 402 has fewer than $10^4$ dislocations cm$^{-2}$, preferably fewer than $10^3$ dislocations cm$^{-2}$, and even more preferably fewer than 100 dislocations cm$^{-2}$, as illustrated in FIG. 4. Tilt boundaries 510 that are present in a c-oriented seed crystal 502 will propagate during growth in the c direction, resulting in a grain structure in bulk GaN grown above 504 the seed that is similar to that in the seed 502, as illustrated schematically in FIG. 5. However, tilt boundaries 510 will radiate outward in bulk GaN that is grown laterally, resulting in progressively larger domains 520 that are free of tilt boundaries 510 as the crystal becomes larger, as illustrated in FIG. 5. The position of the tilt boundaries 510 may be determined by a method that is well known in the art, such as x-ray diffraction, x-ray topography, or simple optical reflection, and a new seed crystal may be cut from the laterally-grown GaN that is entirely free of tilt boundaries. Bulk GaN grown from this new seed crystal will be substantially free of tilt boundaries and will have a dislocation density below $10^4$ cm$^{-2}$, preferably below $10^3$ cm$^{-2}$, and even more preferably below 100 cm$^{-2}$.

Figure 6:
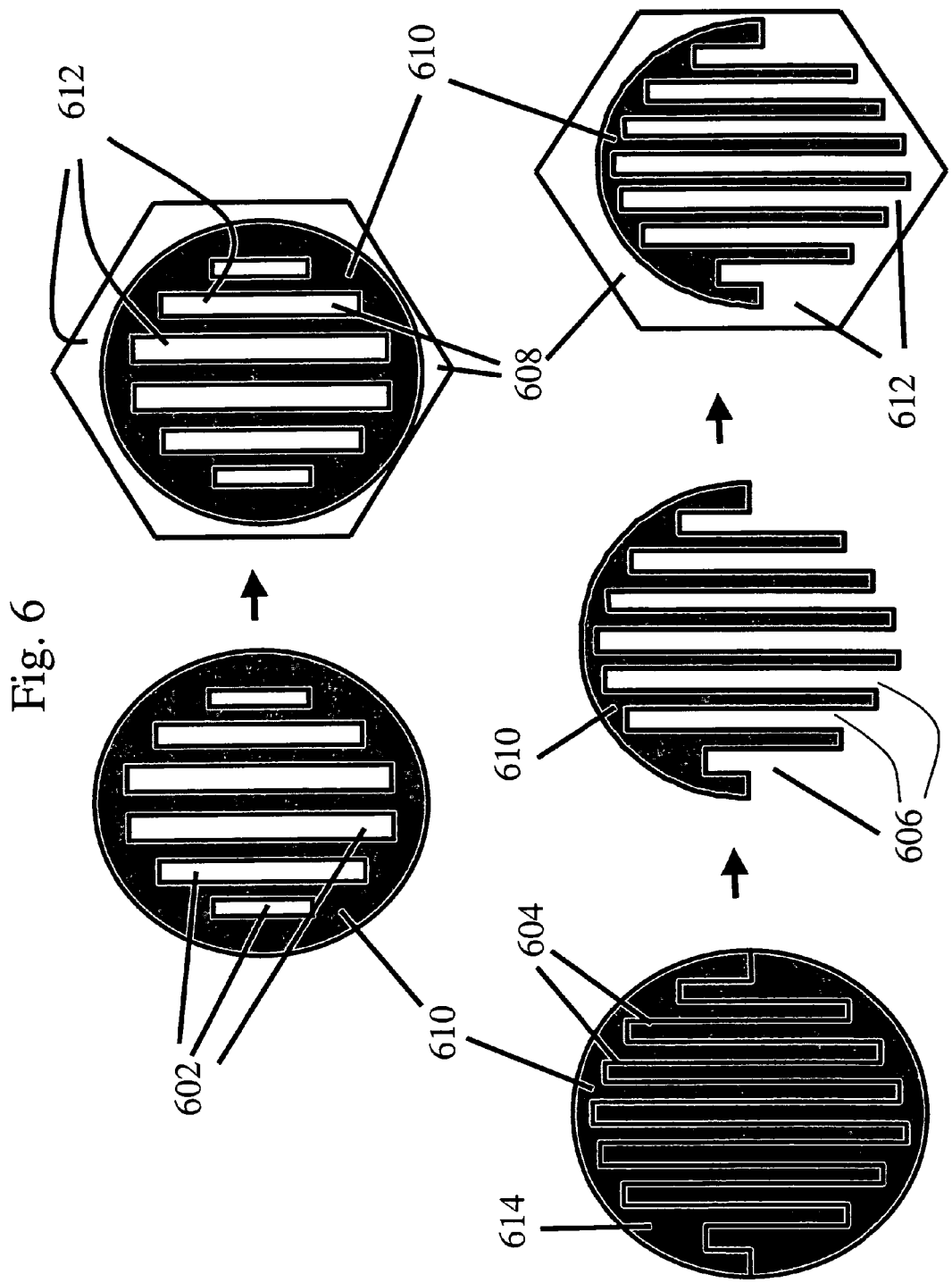
FIG. 6 is a schematic illustration of GaN seeds with cutouts enabling growth of large areas of low-dislocation-density crystals even with defective seeds.

Relatively large areas of GaN with a dislocation density below $10^4$ cm$^{-2}$, preferably below $10^3$ cm$^{-2}$, and even more preferably below 100 cm$^{-2}$ may be prepared using seeds with higher dislocation densities by the following procedure. Holes, cutouts, or zigzag patterns are placed in the seeds by means of cutting by a laser, for example. Examples of such seeds 610 are shown in FIG. 6. The holes, cutouts, or other patterns may be round, elliptical, square, or rectangular, for example. In a preferred embodiment, shown in FIG. 6, the long dimensions of slots 602 or zigzag cuts 604 are oriented approximately parallel to (10$\bar{1}$0) (m plane). In this orientation a steady growth front will occur, filling in the slot 602 or space 606 smoothly. In this way lateral growth 612 can take place in the central portion of a crystal rather than just at the periphery, producing large domains 608 of very low dislocation density, below $10^4$ cm$^{-2}$, material even when using seeds with a relatively high dislocation density, above $10^6$ cm$^{-2}$. This process may be repeated. A crystal grown by the method described above will contain regions of moderately low and very low dislocation densities. Regions of the crystal with higher dislocation densities may be cut out and the crystal used again as a seed. Lateral growth 612 will again fill in the cut out 602 areas with very low dislocation density material 608. In this way large area GaN crystals can be produced that have dislocation densities less than $10^4$ cm$^{-2}$, and preferably less than 100 cm$^{-2}$, over greater than 80% of their area. These crystals will contain tilt boundaries at the regions of coalescence in the laterally-grown material, but the separation between the tilt boundaries can be made larger than 2 mm, 5 mm, 10 mm, 25 mm, or even larger.

By these lateral growth methods, either along the periphery of a seed crystal or with a patterned seed crystal, it is possible to produce GaN crystals with single-crystal grains at least 2 mm or 5 mm, 10 mm, 25 mm, or as large as 600 mm in diameter. Use of a wafer sliced from such a crystal as a substrate enables fabrication of large-area homoepitaxial GaN-based electronic or optoelectronic devices that are substantially free of tilt boundaries.

The source material and one or more seeds, if used, are placed in a pressure vessel or capsule that is divided into at least two regions by means of a porous baffle. An exemplary capsule is described in U.S. patent application Ser. No. 09/683,659 to D'Evelyn et al. filed on Jan. 31, 2002, and entitled "High Temperature Pressure Capsule For Processing Material in Supercritical Fluids," incorporated herein by reference in its entirety.

FIG. 1 illustrates an exemplary capsule 100. The capsule 100 includes a wall 102, which can be sealed to surround a chamber 104 of the capsule 100. The chamber is divided into a first region 108 and a second region 106 separated by a porous baffle 110. During crystallization growth the capsule 100 contains a seed crystal 120 or other nucleation center and a source material 124 separated from each other by the baffle 110. The source material 124 and the seed crystal 120 may be positioned in the second region 106 and the first region 108, respectively, for example. The capsule 100 also contains a solvent material 130. During the growth process, described below, a grown crystal 132 is grown on the seed crystal 120 and the solvent is in a superheated state.

The baffle 110 may comprise, for example, a plate with a plurality of holes in it, or a woven metal cloth. The fractional open area of the baffle 110 may be between 1% and 50%, and preferably between about 5% and about 40%. Transport of nutrient from the source material 124 to the seed crystal 120 or grown crystal 132 is optimized in the solvent as a superheated fluid if the colder portion of the capsule 100 is above the warmer portion, so that self-convection stirs the fluid. In many solvents the solubility of GaN increases with temperature, and in this case the source material 124 should be placed in the bottom warmer portion of the capsule and the seed crystal 120 in the top colder portion of the capsule.

The seed crystal 120 is preferably hung, for example, by a wire (150) through a hole drilled through the seed, so as to allow crystal growth in all directions with a minimum of interference from wall 102 or other materials. The hole may be drilled by a laser, a diamond or abrasive drill, or an ultrasonic drill, for example. The seed crystal 120 may alternatively be hung by tying a wire around one end of the seed.

In the case of some solvents, however, the solubility of GaN decreases with temperature. In this case the seed crystal 120 should be placed in the lower warmer portion of the capsule and the source material 124 in the upper colder portion of the capsule. The source material 124 is preferably placed in a porous basket 140 displaced from the baffle 110 rather than immediately contacting the baffle 110, as the latter arrangement may impede transport of fluid and nutrient through the baffle 110.

A mineralizer may also be added to the capsule 100, in order to increase the solubility of GaN in the solvent, either together with the source material 124 or separately. The mineralizer may comprise at least one of (i) alkali and alkaline-earth nitrides, such as $Li_3N$, $Mg_3N_2$, and $Ca_3N_2$; (ii) amides, such as $LiNH_2$, $NaNH_2$, and $KNH_2$; (iii) urea and related compounds; (iv) ammonium salts, such as $NH_4F$ and $NH_4Cl$; (v) rare earth, halide, sulfide, or nitrate salts, such as $CeCl_3$, $NaCl$, $Li_2S$, or $KNO_3$; (vi) azide salts, such as $NaN_3$; (vii) other Li salts; (viii) combinations of the above; and (ix) compounds formed by chemical reaction of at least one of the above with Ga and/or GaN.

In a preferred embodiment, ammonia is employed as the superheated fluid solvent 130 and at least one of ammonium fluoride, $NH_4F$, gallium fluoride, $GaF_3$, or at least one compound produced by chemical reactions between HF, $NH_3$, Ga, and GaN, is employed as the mineralizer. This combination provides the advantage of a relatively high solubility of GaN while not being overly corrosive to the capsule, particularly when the capsule is fabricated from silver. In this case the effective solubility of GaN decreases with temperature. Without wishing to be bound by theory, the inventors believe that GaN undergoes a chemical reaction with the mineralizer and solvent, forming complexes comprising gallium, fluoride, ammonium ion, and ammonia which are soluble in superheated ammonia. Formation of the complexes is reversible, with an equilibrium constant for formation that decreases with temperature so that formation of free GaN is favored at higher temperature and the effective solubility of GaN decreases with temperature. After ending a crystal growth run with this chemistry, the capsule is typically found to be filled with white needle-shaped crystals. X-ray diffraction analysis indicates that the crystals comprise $GaF_3(NH_3)_2$ and $(NH_4)_3GaF_6$, whose structures are known from the literature.

Optionally, a dopant source is also added to capsule 100, in order to provide n-type, semi-insulating, p-type, magnetic, luminescent, or optically absorbing GaN crystals, or to modify the bandgap. Adventitious impurities such as oxygen or carbon will otherwise normally render the crystals n-type. Dopants such as O, Si, or Ge (n-type), Be, Mg or Zn (p-type), or Al and/or In may be added as impurities in the source GaN. Alternatively, the dopants may be added as metals, salts, or inorganic compounds, such as Si, $Si_3N_4$, InN, $SiCl_4$, $AlCl_3$, $InCl_3$, $BeF_2$, $Mg_3N_2$, $MgF_2$, Zn, $ZnF_2$, or $Zn_3N_2$. Al and/or In may be present at levels up to about 5 mole percent, increasing or decreasing the bandgap with respect to pure GaN. Such doped crystals will be referred to herein as gallium nitride, even though they may contain significant levels of Al and/or In. GaN crystals with total dopant concentrations below about $10^{15}$–$10^{16}$ cm$^{-3}$ are expected to be semi-insulating. Typically, however, the concentration of unintentional impurities is higher than $10^{16}$ cm$^{-3}$ and the crystals are n-type. Semi-insulating GaN crystals may be obtained by doping with at least one of Sc, Ti, V, Cr, Mn, Fe, Co, Ni, or Cu. In a preferred embodiment, semi-insulating GaN crystals are produced by doping with Fe or Co. Magnetic GaN crystals may be obtained by doping with certain transition metals, such as, but not limited to, Mn. Luminescent GaN crystals may be obtained by doping with certain transition or rare-earth metals such as Ti, V, Cr, Mn, Fe, Co, Ni, Zr, Hf, Pr, Eu, Er, or Tm. The transition-metal or rare-earth dopants may be added as impurities in the source GaN or as metals in elemental form, salts, or inorganic compounds, such as Fe, Co, $CoF_2$, CrN, or $EuF_3$, either alone or in combination with one or more additional dopants such as O, Si, Mg, Zn, C, or H. Such dopants may be present in concentrations raging from about $10^{15}$ cm$^{-3}$ to about $10^{21}$ cm$^{-3}$ in the source GaN. Depending on the identity and concentration of the dopant, the GaN crystal may be optically absorbing; i.e., black. For example, heavily Co-doped GaN crystals are black in color and produce no visible photoluminescence upon irradiation with a nitrogen laser.

In one embodiment in order to keep the concentration of undesired dopants, such as oxygen, to an acceptable level, the impurity levels in the raw materials (source gallium nitride, mineralizer, and solvent) and capsules are limited to appropriately low levels. For example, an oxygen concentration below $3\times10^{18}$ cm$^{-3}$ in the grown crystals may be achieved by holding the total oxygen content in the raw materials and capsule below 15 parts per million, with respect to the weight of the final crystal, and an impurity level below $3\times10^{17}$ cm$^{-3}$ may be achieved by holding the total oxygen content in the raw materials and capsule below 1.5 parts per million.

In one embodiment, in order to reduce the concentration of undesired dopants, such as oxygen, to an acceptable level, one or more getters are also added to the capsule. For non-fluoride mineralizers, such as NH$_4$Cl, suitable getters include alkaline earth metals, Sc, Ti, V, Cr, Y, Zr, Nb, Hf, Ta, W, rare earth metals, and their nitrides or halides. When NH$_4$F, HF, GaF$_3$, and/or their reaction products with NH$_3$ and GaN, are used as mineralizers, also referred to herein as acid fluoride mineralizers, highly reactive metals will tend to form fluorides which are then unreactive with water or oxygen in the system. However, compounds of metals which have the property that the free energy of reaction of the metal fluoride with water to form the metal oxide and HF is more negative under crystal growth conditions than the corresponding reaction of GaF$_3$ with water may be used as getters. Suitable getters for use with acid fluoride mineralizers include CrF$_3^-$; ZrF$_4^-$, HfF$_4$, VF$_4$, NbF$_5$, TaF$_5$, and WF$_6$.

The capsule 100 is filled with a solvent 130 that will comprise a superheated fluid under processing conditions, such as, for example, ammonia, hydrazine, methylamine, ethylenediamine, melamine, or other nitrogen-containing fluid. In a preferred embodiment ammonia is employed as the solvent 130. Of the free volume in the capsule, i.e., the volume not occupied by the source material, seed(s), and baffle), between 25% and 100%, or preferably between 70% and 95%, is filled with solvent 130 and the capsule 100 is sealed.

Depending upon the concentration of the mineralizer dissolved into the superheated fluid solvent, under crystal growth conditions the superheated fluid solution can be either supercritical or subcritical. For example, ammonia has a critical temperature and pressure of 132° C. and 113 bar, respectively. The corresponding quantities for NH$_4$F are expected to be similar to the values for NH$_4$Cl, which are about 882° C. and 1635 bar. A solution of NH$_4$F in ammonia may be expected to have a critical point at a temperature and pressure intermediate between the critical temperatures and pressures of the constituents NH$_4$F and ammonia. The presence of gallium-containing complexes in the solution will further modify the equation of state and critical point of the superheated fluid.

In one embodiment, the mineralizer is present at a concentration between 0.5 and 5 mole percent with respect to the solvent. Surprisingly, the inventors have found that acid mineralizers, for example, NH$_4$F and NH$_4$Cl, are effective at concentrations above 10%, 20%, 50%, or more in ammonia. In the case of NH$_4$F, the concentration of "dissolved" GaN, that is, the concentration of Ga present in complexes that are believed to be dissolved under crystal growth conditions, is approximately proportional to the mineralizer concentration at values at least as high as 25%, and that GaN crystal growth is very effective under these conditions. The use of mineralizer concentrations above 20% in ammonia has the added benefit of reducing the pressure of the solvent at a given fill level, thereby reducing the mechanical demands on the pressure vessel.

Methods for filling and sealing the capsule are described in U.S. patent application Ser. No. 09/683,659, to D'Evelyn et al. filed on Jan. 31, 2002, mentioned above, for example. For example, the capsule 100 may be cooled to a temperature at which the solvent 130 is either a liquid or solid. Once the capsule 100 is sufficiently cooled, a solvent source is placed in fluid communication with the open chamber of the capsule 100 and solvent is introduced into the chamber, which is open at this point, by either condensation or injection. After a desired amount of solvent 130 is introduced into the open chamber, the chamber is sealed. The chamber may be sealed, for example, by pinching off or collapsing a portion of the wall 102 to form a weld.

The sealed capsule 100 is placed in a vessel capable of generating temperatures between about 550° C. and about 3000° C., or preferably between about 550° C. and about 1200° C. and a pressure between about 5 kbar and about 80 kbar, or preferably between about 5 kbar and about 20 kbar. An exemplary pressure vessel is described in U.S. application Ser. No. 09/683,658, to D'Evelyn et al. filed on Jan. 31, 2002, and entitled "Improved Pressure Vessel," incorporated herein by reference in its entirety.

Figure 2:
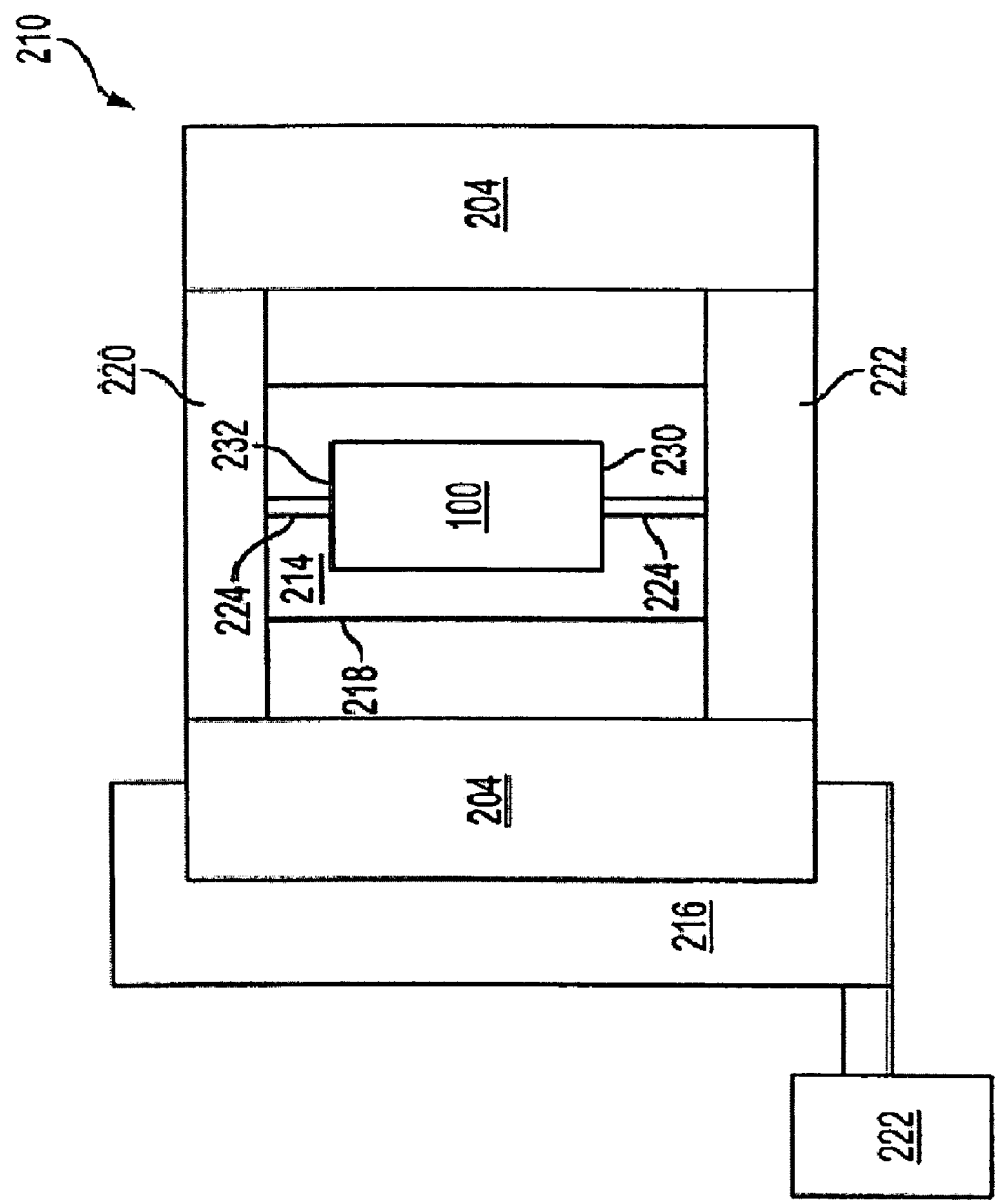
FIG. 2 is a schematic cross-sectional representation of a pressure vessel used for making a GaN single crystal according to a preferred embodiment of the invention.

FIG. 2 illustrates a pressure vessel 210, with enclosed capsule 100. The pressure vessel 210 illustrated in FIG. 2 comprises a hydraulic press with a die. Alternatively, the pressure vessel may comprise a multi-anvil press or a die and reinforced end flanges as described in U.S. application Ser. No. 09/683,658 mentioned above.

The pressure vessel 210 contains a pressure medium 214 enclosed by compression die 204 and top and bottom seals 220 and 222. The pressure medium may be, for example, NaCl, NaBr or NaF.

The pressure vessel 210 includes a wattage control system 216 for controlling the heating of the capsule 100. The wattage control system 216 includes a heating element 218 to provide heating to the capsule 100, and a controller 222 for controlling the heating element 218. The wattage control system 216 also preferably includes at least one temperature sensor 224 proximate to the capsule 100 for generating temperature signals associated with the capsule 100.

The pressure vessel 210 is preferably arranged to provide a temperature distribution, i.e., the temperature as a function of the position within the capsule chamber, within the capsule chamber, including a temperature gradient within the capsule 100. In one embodiment, the temperature gradient may be achieved by placing the capsule 100 closer to one end of the cell (the region within the pressure vessel 210) than the other. Alternatively, the temperature gradient is produced by providing at least one heating element 218 having a non-uniform resistance along its length. Non-uniform resistance of the at least one heating element 218 may be provided, for example, by providing at least one heating element 218 having a non-uniform thickness, by perforating the at least one heating element 218 at selected points, or by providing at least one heating element 218 that comprises a laminate of at least two materials of differing resistivity at selected points along the length of the at least one heating element 218. In one embodiment, the at least one temperature sensor 224 comprises at least two independent temperature sensors provided to measure and control the temperature gradient between the opposite ends 230, 232 of the capsule 100. In one embodiment, closed-loop temperature control is provided for at least two locations within the cell. The at least one heating element 218 may also comprise multiple zones which may be individually powered to achieve the desired temperature gradient between two ends of the capsule 100. An exemplary apparatus and method for providing independent temperature control of at least two locations within a high pressure cell is described in U.S. Patent Application 60/435,189 "High pressure/high temperature apparatus with improved temperature control for crystal growth," to D'Evelyn et al. filed on Dec. 18, 2002, which is incorporated herein by reference in its entirety.

The capsule 100 is heated to the growth temperature, preferably between about 550° C. and 1200° C., at an average rate between about 1° C./hr and 1000° C./hr. A temperature gradient may be present in the capsule, due to asymmetric placement of the capsule in the cell, non-symmetric heating, or the like, as described above with respect to the pressure cell 210. This temperature gradient has the effect of creating a supersaturation throughout the heating sequence, which the inventors have found promotes spontaneous nucleation.

In an embodiment of the present invention the temperature gradient at the growth temperature is initially held small, less than about 25° C. and preferably less than about 10° C., for a period between about 1 minute and 2 hours, in order to allow the system to equilibrate in an equilibrium stage. The temperature gradient as used in this application is the difference in the temperature at the ends of the capsule, for example, where the control thermocouples are located. The temperature gradient at the position of the seed crystal 120 or nucleation center with respect to the temperature at the position of the source material 124 is likely to be somewhat smaller.

Optionally, the temperature gradient is set in the equilibrium stage to be opposite in sign to that where crystal growth occurs on the nucleation center (i.e., so that etching occurs at the nucleation center and growth occurs on the source material) so as to etch away any spontaneously-nucleated crystals in the region of the capsule where the nucleation center is provided that may have formed during heating. In other words, if the crystal growth occurs for a positive temperature gradient, then the temperature gradient is set to be negative, and vice versa.

After this equilibration period, a growth period may be provided where the temperature gradient is increased in magnitude and has a sign such that growth occurs at the seed crystal at a greater rate. For example the temperature gradient may be increased at a rate between about 0.01° C./hr and 25° C./hr, to a larger value where growth is faster. During the crystal growth the temperature gradient may be held at a magnitude of between 5° C. and 300° C. and may be adjusted either upward or downward during growth. Optionally, the temperature gradient may be changed to have a sign opposite to the sign where growth occurs at the seed crystal. The sign of the gradient may be reversed one or more additional times in order to alternately etch away any spontaneously-formed nuclei and promote growth on one or more nucleation centers or seed crystals 120. The HPHT conditions are maintained for a length of time sufficient to dissolve a substantial portion of the source gallium nitride and precipitate it onto at least one gallium nitride crystal, gallium nitride boule, or gallium nitride crystal seed.

At the conclusion of the growth period the temperature of the capsule may be ramped down at a rate between about 1° C./hr and 1000° C./hr, and preferably between about 1° C./hr and 300° C./hr so as to minimize thermal shock to the grown crystal 132. The cell, including the capsule and pressure medium, is removed from the pressure vessel 210 and the capsule 100 is removed from the cell.

The solvent 130 may be conveniently removed by chilling the capsule to reduce the vapor pressure of the solvent below 1 bar, puncturing the capsule, and then allowing it to warm so that the solvent evaporates. The capsule is cut open and the grown crystal(s) removed. The crystal(s) may be washed by an appropriate wash, such as, for example, at least one of water, alcohol or other organic solvent, and mineral acids to remove mineralizer.

In an alternative embodiment, a high quality seed crystal, substantially free of tilt boundaries and with a dislocation density below about $10^4$ cm$^{-2}$, is used as a substrate for deposition of a thick film of AlInGaN by another crystal growth method. In one embodiment, the other crystal growth method comprises hydride vapor phase epitaxy (HVPE).

The quality of the single crystal may be indicated by characterization techniques, such as photoluminescence, which occurs at the band edge at room temperature for GaN. The crystal may be further processed and sliced into one or more wafers, lapped, polished, and chemically polished. Methods for slicing include sawing with a wire saw or with an annular saw and are well known in the art. Lapping and polishing may be performed with a slurry containing diamond, silicon carbide, alumina, or other hard particles. Polishing may leave lattice damage in the GaN wafer that may be removed by a number of methods, including chemical mechanical polishing, dry etching by reactive ion etching (RIE), high density inductively-coupled plasma (ICP) plasma etching, electron cyclotron resonance (ECR) plasma etching, and chemically assisted ion beam etching (CAIBE). The polished wafer has an rms surface roughness below about 1 nm over a lateral area of at least 10×10 mm$^2$. Preferably, the surface roughness is below 0.5 nm over a lateral area of at least 10×10 mm$^2$. The wafer or substrate preferably has a thickness between about 0.01 and 10 mm, most preferably between about 0.05 and 5 mm. The surface of the GaN wafer is preferably flat to less than 1 micron. The front and back surfaces of the GaN wafer are preferably parallel to better than 1°. In one embodiment, the crystallographic orientation of the front of the GaN wafer is within about 10° of one of the (0001) orientation, the (000$\bar{1}$) orientation, the (10$\bar{1}$0) orientation, the (11$\bar{2}$0) orientation, and the (10$\bar{1}$1) orientation. In another embodiment, the orientation of the front of the GaN wafer is within about 5° of one of these orientations.

Figure 7A:
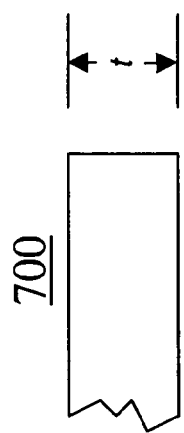
FIG. 7 is a schematic illustration of the edges of GaN wafers with (a) a simply-ground edge; (b) a chamfered edge, or (c) a rounded edge.
Figure 7B:
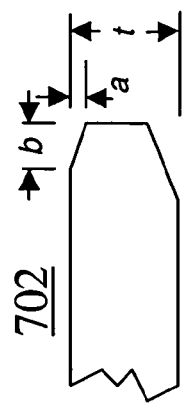
Figure 7C:
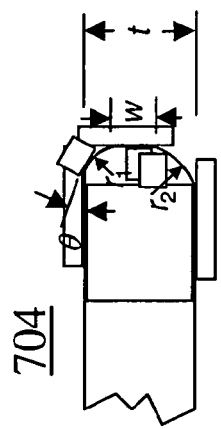

The GaN is typically ground to a round or square shape, with one or more additional flats to indicate the crystallographic orientation. In one embodiment 700, the edge of the GaN wafer is simply ground, as shown schematically in FIG. 7(a). However, the inventors have found that GaN crystals or wafers crack easily, and a GaN wafer with a simply ground edge is particularly susceptible to chipping and cracking. In a preferred embodiment 710, a chamfer is ground on at least one of the front and back surfaces, as shown schematically in FIG. 7(b). The chamfer is ground on the edge of the wafer using apparatus that is well known in the art. The depth of the chamfer (dimension "a" in FIG. 7(b)) is typically between about 10 μm and 0.2 t (dimension "t" in FIG. 7(b)), where t is the thickness of the wafer. The width of the chamfer (dimension "b" in FIG. 7(b)) is typically between a and 5a. If both the top (side on which epitaxy will be performed) and the bottom of the wafer are chamfered, the larger chamfer is typically placed on the bottom. A slight curvature is preferably present at the edges of the chamfered portions rather than sharp edges. In addition to reducing the tendency for the wafer to be chipped or cracked during handling, the chamfer also reduces the likelihood of "crowning" or poor morphology of epitaxially-grown AlInGaN near the periphery of the wafer. In a still more preferred embodiment 720, the edge of the wafer is rounded, as shown schematically in FIG. 7(c). The radius of curvature of the top edge (dimension "$r_1$" in FIG. 7(c)) the wafer is typically between 10 μm and 0.5 t (dimension "t" in FIG. 7(c)), where t is the thickness of the wafer. The angle $\Theta$ between the inside edge of the rounded portion and the top surface of the wafer is preferably less than 30°. The radius of curvature (dimension "$r_2$" in FIG. 7(c)) of the bottom edge of the wafer is typically greater than $r_1$, and also forms an angle with the bottom surface of the wafer that is preferably less than 30°. The thickness of the unrounded edge (dimension "w" in FIG. 7(c)) of the wafer may be zero and is preferably less than 0.5 t.

This single crystal gallium nitride crystal, and wafers formed therefrom, are useful as substrates for electronic and optoelectronic devices.

The crystal may be characterized by standard methods that are known in the art. For determining the dislocation density, Cathodoluminescence (CL) and etch pit density are convenient. CL imaging provides a non-destructive measure of dislocation density, and requires no sample preparation. Dislocations are non-radiative recombination centers in GaN, and therefore appear in CL as dark spots. One can simply measure the concentration of dark spots in CL images to determine the dislocation density.

A second convenient method, which may be more definitive in some cases, is etch pit density. One such etch method, for example, is a vapor-phase HCl etch, as described by T. Hino et al., Appl. Phys. Lett. 76, 3421 (2000) incorporated by reference.

Figure 9:
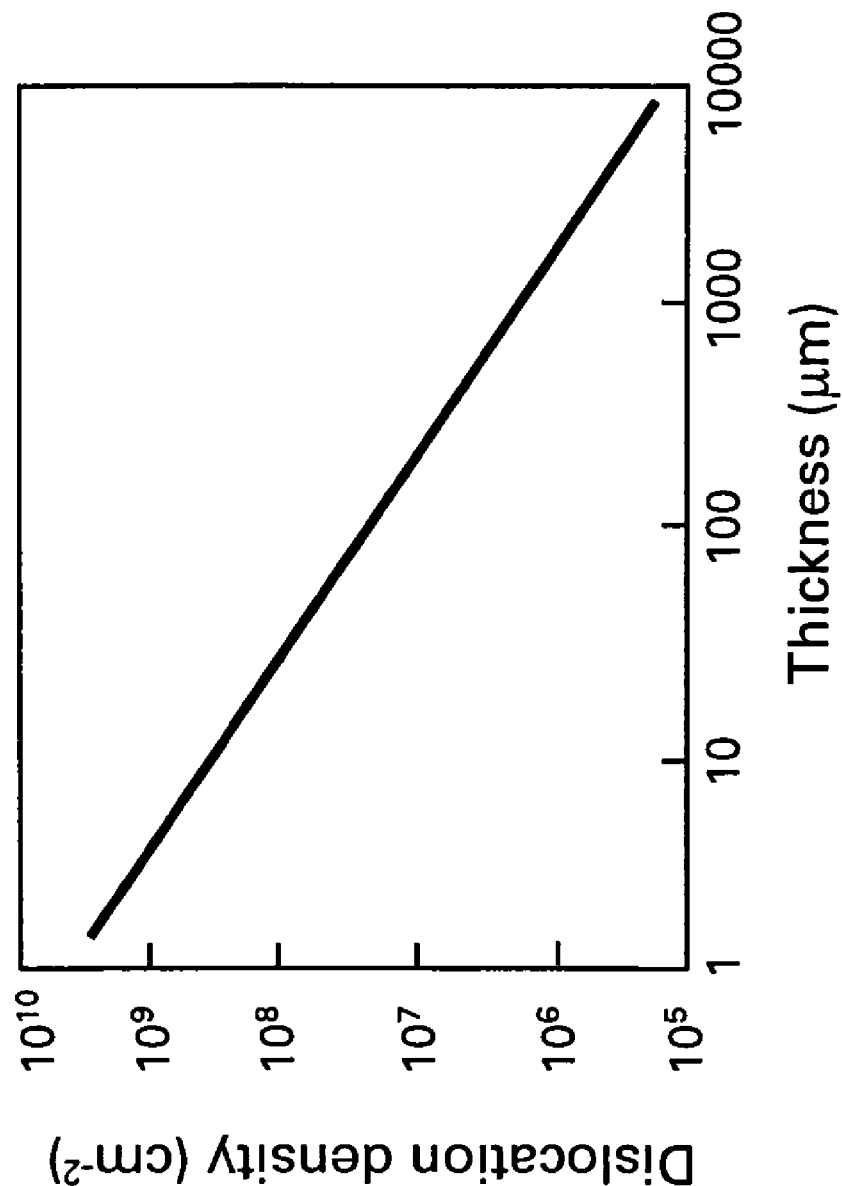
FIG. 9 shows the approximate dislocation density as a function of thickness for GaN films grown by HVPE.

Both of these methods were applied to the Ga face of a sample of commercial-grade HVPE GaN dislocation densities (dark-spot densities or etch pit densities) of $1-2 \times 10^7$ $cm^{-2}$ were obtained, in excellent agreement with the values reported by others on similar material and those values shown in FIG. 9.

The optical absorption and emission properties of the grown GaN can be determined by optical absorption, scattering, and photoluminescence spectroscopies, as are well known in the art. The electrical properties can be determined by Van der Pauw and Hall measurements, by mercury-probe CV, and by hot-probe techniques.

The crystal may be sliced into one or more wafers by methods that are well known in the art. The GaN crystal or wafer is useful as a substrate for epitaxial $Al_xIn_yGa_{1-x-y}N$ films where $0 \leq x \leq 1$, $0 \leq y \leq 1$ and $0 \leq x+y \leq 1$, light emitting diodes, laser diodes, photodetectors, avalanche photodiodes, transistors, diodes, and other optoelectronic and electronic devices. Epitaxial GaN or $Al_xIn_yGa_{1-x-y}N$ layers, where $0 \leq x, y, x+y \leq 1$, deposited on GaN wafers fabricated from the bulk GaN crystals described herein will similarly be substantially free of tilt boundaries and will have a dislocation density below $10^4$ $cm^{-2}$, preferably below $10^3$ $cm^{-2}$, and, even more preferably, below 100 cm. Exemplary methods of forming homoepitaxial light emitting diodes and laser diodes on a GaN substrate are described, for example, in U.S. patent application Ser. No. 09/694,690, filed Oct. 23, 2000 by D'Evelyn et al., "Homoepitaxial GaN-based Light Emitting Device and Method for Producing," which is incorporated herein by reference in its entirety. Exemplary methods of forming homoepitaxial photodetectors on a GaN substrate are described, for example, in U.S. patent application Ser. No. 09/839,941, filed Apr. 20, 2001 by D'Evelyn et al., entitled "Homoepitaxial GaN-Based Photodetector and Method for Producing," which is incorporated herein by reference in its entirety. Exemplary methods of forming avalanche photodiodes on a GaN substrate are described, for example, in U.S. patent application Ser. No. 10/314,986, filed Dec. 10, 2002 by Sandvik et al., entitled "Avalanche Photodiode for Use in Harsh Environments," which is incorporated herein by reference in its entirety. Due to the substantial absence of tilt boundaries and the low dislocation density of the substrate, the homoepitaxial light-emitting device is substantially free of tilt boundaries and, for a device area up to about $10^4$ μm², or up to about $9 \times 10^4$ μm², or up to 1 mm², most devices are substantially free of threading dislocations.

The above described embodiments provide improved nucleation control by including an equilibration period in the temperature program, in which the temperature gradient is substantially reduced, or even set to be zero or negative, with respect to the gradient during crystal growth, and by hanging the seed crystal within the growth chamber. The improved crystal growth method provides high quality, large area GaN crystals.

A GaN single crystal formed by the above method was characterized using etch pit density measurements, photoluminescence, and optical absorption techniques. The single crystal formed is characterized by a dislocation density below 100 $cm^{-1}$, a photoluminescence spectrum which peaks at a photon energy of between about 3.38 and about 3.41 eV at a crystal temperature of 300° K, and has an optical absorption coefficient below 5 $cm^{-1}$ for wavelengths between 700 nm (red) and 465 nm (blue).

Figure 8:
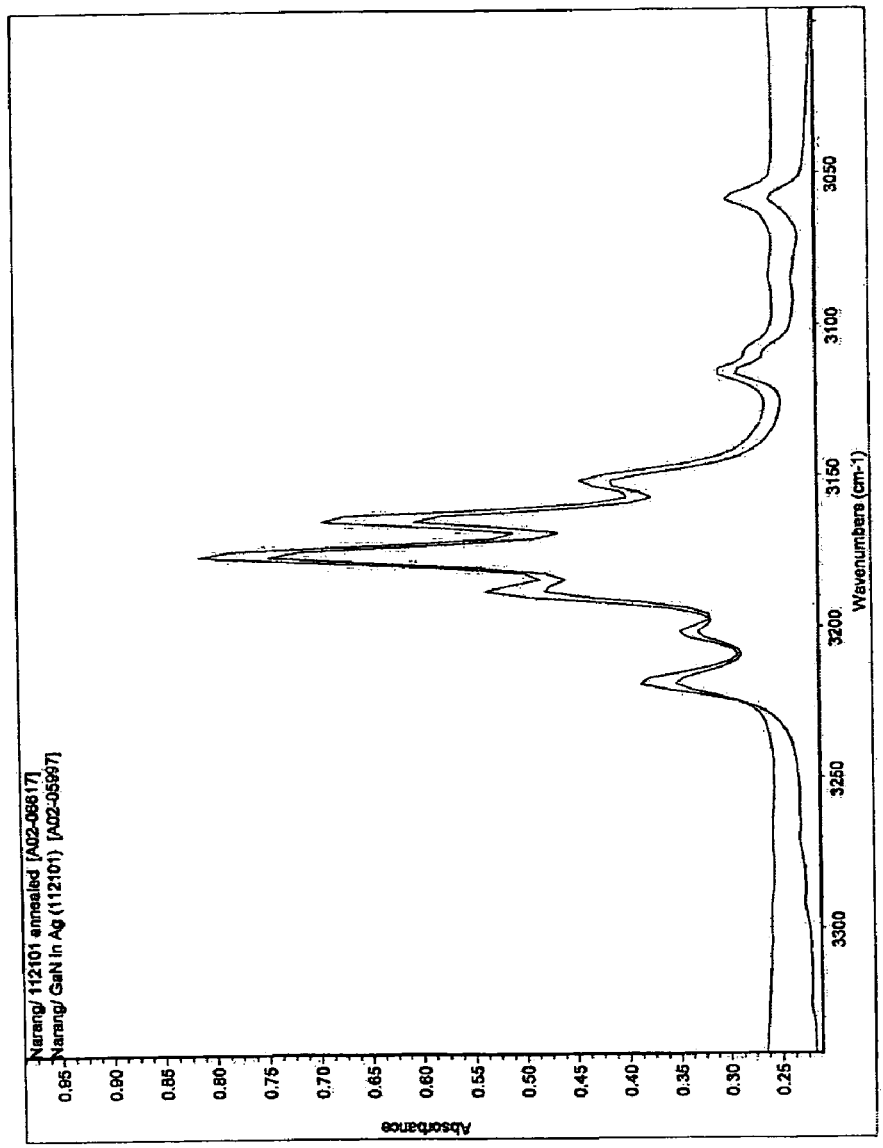
FIG. 8 shows the infrared spectrum of an exemplary bulk GaN substrate.

A GaN single crystal formed by the above method was characterized by infrared transmission spectroscopy and by Raman spectroscopy. In contrast to GaN grown by other methods, the GaN grown by the method described herein had several sharp absorption peaks in the range of 3050 to 3300 $cm^{-1}$, with a maximum absorption near 3175 $cm^{-1}$, as shown in FIG. 8. The crystal was annealed to 750° C. in high purity nitrogen for 30 min and the infrared spectrum was re-measured. The absorption peaks in the range of 3050 to 3300 $cm^{-1}$ were essentially unchanged, as shown in FIG. 8, indicating a high stability of the species responsible for the absorption peaks. Based on predictions of vibrational frequencies of 3100–3470 $cm^{-1}$ for $V_{Ga}H_1$–$V_{Ga}H_4$ (which may overestimate the actual frequencies by about 200 $cm^{-1}$) and the observation of infrared absorption features at 3020–3050 $cm^{-1}$ and at 3140 $cm^{-1}$ in hydrogen-implanted GaN [M. G. Weinstein et al., Appl. Phys. Lett. 72, 1703 (1998)], we believe that the absorption peaks between 3150 and 3200 $cm^{-1}$ in our samples correspond to $V_{Ga}H_3$ and $V_{Ga}H_4$, that the absorption peaks observed between 3000 and 3150 $cm^{-1}$ in both our crystal and hydrogen-implanted GaN correspond to $V_{Ga}H_1$ and $V_{Ga}H_2$, and that other minor peaks may be associated with the presence of other impurities or defects. Thus, the presence of an infrared absorption feature near 3175 $cm^{-1}$ in GaN crystals grown by the method described herein indicates passivation of gallium vacancies, and the persistence of the infrared feature upon high temperature annealing indicates that this passivation is quite stable. Depending on the concentration of hydrogenated gallium vacancies in the GaN crystal, the absorbance per unit thickness of the 3175 $cm^{-1}$ peak will lie between about 0.01 and 200 $cm^{-1}$.

Additional evidence for the passivation of point defects in a GaN crystal grown by the method described herein was obtained by Raman spectroscopy. A total of five peaks were observed in two configurations between 400 and 800 $cm^{-1}$.

The peaks, with their respective assignments given in brackets, were observed at 530 cm$^{-1}$ [A$_1$(TO)], 558 cm$^{-1}$ [E$_1$(TO)], 569 cm$^{-1}$ [E$_2$ (high)], 734 cm$^{-1}$ [A$_1$(LO)], and 742 cm$^{-1}$ [E$_1$(LO)]. These values are all within a few cm$^{-1}$ of accepted values for pure GaN reported in the literature. Significantly, a broad peak associated with phonon-plasmon coupling was not observed. The observation of unshifted LO modes and the absence of a phonon-plasmon mode indicates a carrier concentration below 10$^{17}$ cm$^{-3}$, based on Raman measurements reported in the literature on GaN with carrier concentrations between 10$^{16}$ cm$^{-3}$ and 10$^{20}$ cm$^{-3}$. The total impurity concentration in this crystal was above 10$^{19}$ cm$^{-3}$. The drastic reduction in carrier concentration relative to the impurity concentration indicates a high degree of compensation, most likely due to hydrogen.

The incorporated hydrogen is believed to be benign or possibly even beneficial. Typical gallium nitride crystal growth methods do not provide passivation of gallium vacancies by hydrogenation, even if hydrogen is in the growth system. For example, infrared transmission spectroscopy on 300–400 mm thick GaN samples grown by hydride vapor phase epitaxy (HVPE) revealed weak absorption features near 2850 and 2915 cm$^{-1}$ associated with another defect, but no absorption features between 3100 and 3500 cm$^{-1}$ that could be assigned to hydrogenated Ga vacancies were observed in the HVPE gallium nitride material.

Within the visible spectrum, the gallium nitride boule typically exhibits substantial transparency. The optical absorption coefficient for nominally undoped crystals is generally less than 5 cm$^{-1}$ between 465 nm and 700 nm. Doped crystals exhibit similarly low absorption, although some free carrier absorption may be introduced at high carrier concentrations. Moreover, dopants, substitutional or interstitial impurities, vacancy complexes, or other point defects may introduce narrow peaks of higher absorption within the visible range. Such point defect-related narrow absorption peaks typically do not, however, significantly reduce the substantial transparency of the crystal in the visible for purposes such as backside extraction of emitted light.

In the case where a gallium nitride boule is grown using at least one of NH$_4$F, GaF$_3$, or other compounds obtainable by reaction of Ga, GaN, NH$_3$, and HF, as mineralizer, the gallium nitride may contain at least about 0.04 ppm fluorine, and typically between about 0.04 and 1 ppm fluorine. By contrast, GaN crystals grown with fluorine-free mineralizers typically contain less than 0.02 ppm fluorine. As with the case of incorporated hydrogen, the incorporated fluorine is believed to be benign or possibly even beneficial. Bond lengths to fluorine in molecules or solids are typically only slightly larger than the corresponding bonds to hydrogen, so that fluorine may play a similar role passivating defects.

After the GaN crystal has been formed, the crystal or boule is further processed and sliced into one or more wafers, lapped, polished, and chemically polished. The wafer or substrate preferably has a thickness between about 0.01 and 10 mm, most preferably between about 0.05 and 5 mm, and is useful as a substrate for the device fabrication. In one embodiment, the wafer comprises n-type GaN, with an electrical resistivity less than about 100 Ω-cm, more preferably less than about 10 Ω-cm, or even more preferably less than about 1 Ω-cm. In another embodiment, the wafer comprises p-type GaN, and in still another embodiment the wafer comprises semi-insulating GaN. The substrate is then polished to a mirror finish using mechanical-polishing techniques that are known in the art. Subsurface damage may remain after the polishing process. This damage may be removed by several methods that are known in the art, including chemically assisted ion beam etching, reactive ion etching, chemo-mechanical polishing, and photoelectrochemical or wet chemical etching. The residual damage may also be removed by heating the wafer to a temperature between about 700° C. and 1500° C. in a nitrogen-containing atmosphere, such as, for example, N$_2$ or ammonia, at a partial pressure between about 10$^{-8}$ mbar and 20,000 bar. The substrate preferably has a thickness between about 0.01 mm and 10 mm, most preferably between about 0.05 mm and 5 mm.

EXAMPLES

The following Comparative Examples (Comparative Examples 1–3) are provided for comparison to the Examples (Examples 1–4). The Comparative Examples do not constitute prior art to the present invention, but are provided for comparison purposes.

Comparative Example 1

0.1 g of NH$_4$F mineralizer was placed in the bottom of a 0.5 inch diameter silver capsule. A baffle with 5.0% open area was placed in the middle portion of the capsule, and 0.31 g of polycrystalline GaN source material was placed in the upper half of the capsule. The capsule was then enclosed within a filler/sealing assembly together with a 0.583 inch diameter steel ring. The capsule and filler/sealing assembly were transferred to a gas manifold and filled with 0.99 g of ammonia. Next, a plug was inserted into the open top end of the capsule, such that a cold weld was formed between the silver capsule and silver plug and the steel ring surrounded the plug and provided reinforcement. The capsule was then removed from the filler/sealing assembly and inserted in a zero stroke high pressure high temperature (HPHT) apparatus. The cell was heated to approximately 700° C. and held at this temperature for 55 hours, with a temperature gradient of approximately 85° C. The cell was then cooled and removed from the press. Upon opening the capsule after venting of the ammonia, numerous spontaneously-nucleated crystals were observed at the bottom of the capsule. One crystal approximately 0.36 mm in diameter was selected at random and etched in 10% HCl in Ar at 625° C. for 30 min. No etch pits were observed. The area of the exposed c-face was approximately 5.3×10$^{-4}$ cm$^2$, indicating that the etch pit density was less than (1/(5.3×10$^{-4}$ cm$^2$)) or 1900 cm$^{-2}$. By contrast, the identical etching treatment was applied to a 200 µm-thick piece of GaN grown by hydride/halide vapor phase epitaxy (HVPE), and an etch pit density of 2×10$^7$ cm$^{-2}$ was observed on the Ga face. The observed etch pit density of the HVPE-grown sample was in good agreement with FIG. 9 for material that was grown to a thickness of about 300 µm before being lapped and polished.

Comparative Example 2

Three seeds, weighing 3–4 mg each, were placed in the bottom of a 0.5 inch diameter silver capsule along with 0.10 g of NH$_4$F mineralizer. A baffle with 5.0% open area was placed in the middle portion of the capsule, and 0.34 g of polycrystalline GaN source material was placed in the upper half of the capsule. The capsule was then enclosed within a filler/sealing assembly together with a 0.675 inch diameter steel ring. The capsule and filler/sealing assembly were transferred to the gas manifold and filled with 1.03 g of ammonia. Next, the plug was inserted into the open top end of the capsule, such that a cold weld was formed between the silver capsule and silver plug and the steel ring surrounded the plug and provided reinforcement. The capsule was then removed from the filler/sealing assembly and inserted in a zero stroke HPHT apparatus. The cell was heated at about 15° C./min to approximately 500° C., then at 0.046° C./min to 700° C., and held at the latter temperature for 6 hours, with a temperature gradient of approximately 28° C. The cell was then cooled and removed from the press. Upon opening the capsule after venting of the ammonia, numerous spontaneously-nucleated crystals were observed at the bottom of the capsule and, despite the very slow heating rate, very little growth on the seeds occurred, relative to growth on spontaneously-nucleated crystals.

Comparative Example 3

A GaN seed, weighing 10.4 mg, was placed in the bottom of a 0.5 inch diameter silver capsule along with 0.04 g of $NH_4F$ mineralizer. A baffle with 5.0% open area was placed in the middle portion of the capsule, and 0.74 g of polycrystalline GaN source material was placed in the upper half of the capsule. The capsule was then enclosed within a filler/sealing assembly together with a 0.675 inch diameter steel ring. The capsule and filler/sealing assembly were transferred to the gas manifold and filled with 1.14 g of ammonia. Next, the plug was inserted into the open top end of the capsule, such that a cold weld was formed between the silver capsule and silver plug and the steel ring surrounded the plug and provided reinforcement. The capsule was then removed from the filler/sealing assembly and inserted in a zero stroke HPHT apparatus. The cell was heated at about 15° C./min to approximately 500° C., then at 0.05° C./min to 680° C., and held at the latter temperature for 53 hours, with a temperature gradient of approximately 70° C. The cell was then cooled and removed from the press. Upon opening the capsule after venting of the ammonia, numerous spontaneously-nucleated crystals were observed at the bottom of the capsule despite the very slow heating rate. The seed did grow significantly, to a weight of 41.7 mg and a diameter of about 2 mm. However, the weight of spontaneously-nucleated crystals was more than 10× the weight increase of the seed.

Example 1

Figure 3:
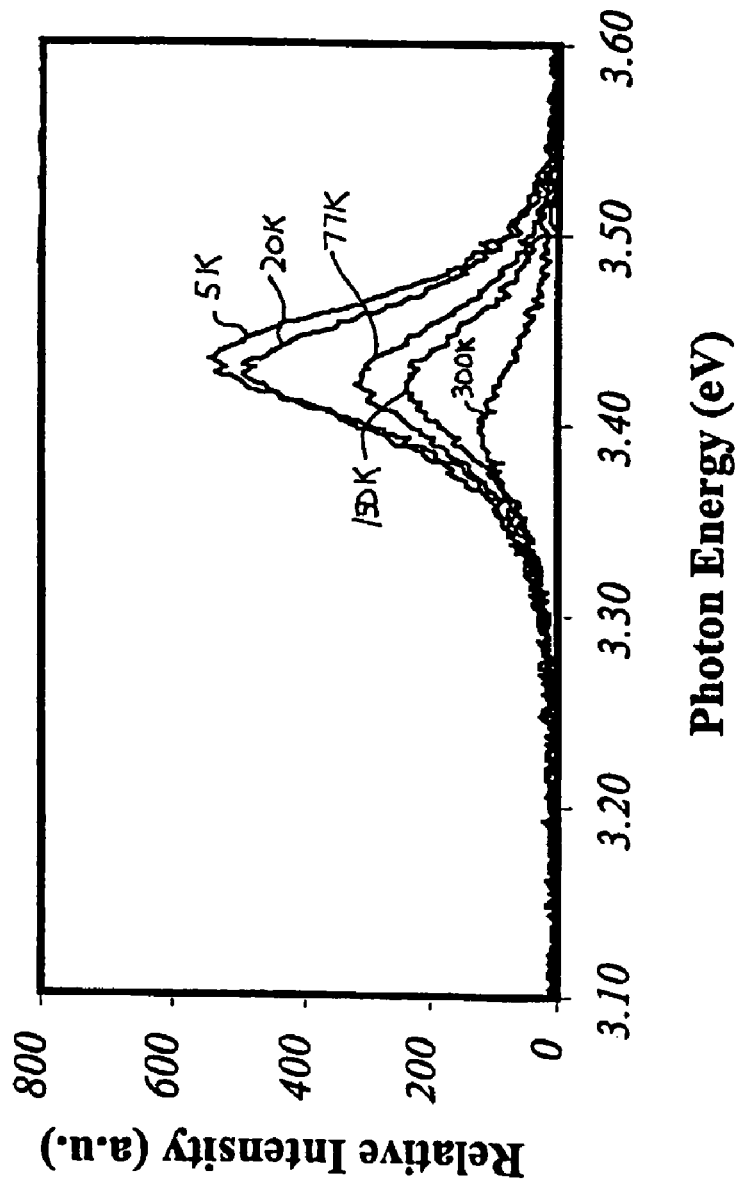
FIG. 3 is a series of photoluminescence spectra of a GaN crystal according to a preferred embodiment of the invention.

A small hole was drilled by a high-power laser through a GaN seed crystal weighing 19.7 mg. The seed was hung by a 0.13-mm silver wire from a silver baffle with a 35% open area and placed in the lower half of a 0.5 inch diameter silver capsule along with 0.10 g of $NH_4F$ mineralizer. 0.74 g of polycrystalline GaN source material was placed in the upper half of the capsule. The capsule was then enclosed within a filler/sealing assembly together with a 0.583 inch diameter steel ring. The capsule and filler/sealing assembly were transferred to a gas manifold and filled with 0.99 g of ammonia. Next, the plug was inserted into the open top end of the capsule, such that a cold weld was formed between the silver capsule and silver plug and the steel ring surrounded the plug and provided reinforcement. The capsule was then removed from the filler/sealing assembly and inserted in a zero stroke HPHT apparatus. The cell was heated at a rate of about 11° C./min until the temperature of the bottom of the capsule was approximately 700° C. and the temperature of the top half of the capsule was approximately 660° C., as measured by type K thermocouples. The current through the top half of the heater was then increased until the temperature gradient $\Delta T$ decreased to zero. After holding at $\Delta T=0$ for 1 hour, the temperature of the top half of the capsule was decreased at 5° C./hr until $\Delta T$ increased to approximately 35° C., and the temperatures were held at these values for 78 hr. The cell was then cooled and removed from the press. Upon opening the capsule after venting of the ammonia, the seed weight was observed to have increased to 33.4 mg. The crystal was characterized by photoluminescence, using a 266 nm excitation (frequency-quadrupled YAG). The spectra at several temperatures are shown in FIG. 3. Specifically the crystal sample was characterized by photoluminescence at temperatures of 5 K, 20 K, 77 K and 300 K. At all temperatures in the range of 5K–300 K, the luminescence peak occurs between 3.38 and 3.45 eV.

Example 2

A GaN seed crystal weighing 12.6 mg, obtained from a previous run, was hung through a laser-drilled hole by a 0.13-mm silver wire from a silver baffle with a 35% open area and placed in the lower half of a 0.5 inch diameter silver capsule. 0.10 g of $NH_4F$ mineralizer and 1.09 g of polycrystalline GaN source material were placed in the upper half of the capsule. The capsule was then enclosed within a filler/sealing assembly together with a 0.583 inch diameter steel ring. The capsule and filler/sealing assembly were transferred to the gas manifold and filled with 0.95 g of ammonia. Next, the plug was inserted into the open top end of the capsule, such that a cold weld was formed between the silver capsule and silver plug and the steel ring surrounded the plug and provided reinforcement. The capsule was then removed from the filler/sealing assembly and inserted in a zero stroke HPHT apparatus. The cell was heated at a rate of about 11° C./min until the temperature of the bottom of the capsule was approximately 700° C. and the temperature of the top half of the capsule was approximately 640° C., as measured by type K thermocouples. The current through the top half of the heater was then increased until the temperature gradient $\Delta T$ decreased to zero. After holding at $\Delta T=0$ for 1 hour, the temperature of the top half of the capsule was decreased at 5° C./hr until $\Delta T$ increased to approximately 50° C., and the temperatures were held at these values for 98 hr. The cell was then cooled and removed from the press. Upon opening the capsule after venting of the ammonia, the seed had grown to a weight of 24.3 mg. The crystal was then etched in 10% HCl in Ar at 625° C. for 30 min. Some etch pits were observed on the c-face above the region of the seed, with an etch pit density of about $10^6$ $cm^{-2}$. However, the areas that grew laterally with respect to the seed were free of etch pits. The area of newly laterally-grown GaN was approximately $3.2 \times 10^{-2}$ $cm^2$, indicating that the etch pit density was less than $(1/3.2 \times 10^{-2}$ $cm^2)$ or 32 $cm^{-2}$.

Example 3

Two GaN seeds, weighing 48.4 mg and 36.6 mg and obtained from a previous run, were hung through laser-drilled holes by a 0.13-mm silver wire from a silver baffle with a 35% open area and placed in the lower half of a 0.5 inch diameter silver capsule. 0.10 g of $NH_4F$ mineralizer and 1.03 g of polycrystalline GaN source material were placed in the upper half of the capsule. The capsule was then enclosed within a filler/sealing assembly together with a 0.583 inch diameter steel ring. The capsule and filler/sealing assembly were transferred to the gas manifold and filled with 1.08 g of ammonia. Next, the plug was inserted into the open top end of the capsule, such that a cold weld was formed between the silver capsule and silver plug and the steel ring surrounded the plug and provided reinforcement. The capsule was then removed from the filler/sealing assembly and inserted in a zero stroke HPHT apparatus. The cell was heated at about 1° C./min until the temperature of the bottom of the capsule was approximately 700° C. and the temperature of the top half of the capsule was approximately 642° C., as measured by type K thermocouples. The current through the top half of the heater was then increased until the temperature gradient ΔT decreased to zero. After holding at ΔT=0 for 1 hour, the temperature of the top half of the capsule was decreased at 5° C./hr until ΔT increased to approximately 30° C., and the temperatures were held at these values for 100 hr. The cell was then cooled and removed from the press. Upon opening the capsule after venting of the ammonia, the seeds had grown to a weight of 219.8 mg. A piece broke off from the smaller of the two crystals and was selected for analysis. An optical transmission spectrum of the crystal was measured using a Cary 500$i$ spectrometer. The transmission was greater than 60% for wavelengths ranging from red (700 cm$^{-1}$) to blue (465 cm$^{-1}$). Based on the index of refraction for GaN [G Yu et al., Applied Physics Letters 70, 3209 (1997)] and the thickness of the crystal, 0.206 mm, the optical absorption coefficient was less than 5 cm$^{-1}$ over the same wavelength range. The crystal was determined to have n-type electrical conductivity by means of a hot-point probe measurement. The crystal was then etched in 10% HCl in Ar at 625° C. for 30 min. The entire crystal was free of etch pits. The area of the c-face of the crystal was approximately 4.4×10$^{-2}$ cm$^2$, indicating that the etch pit density was less than (1/4.4×10$^{-2}$ cm$^2$) or 23 cm$^{-2}$.

Example 4

A GaN seed weighing 25.3 mg, obtained from a previous run, was hung through a laser-drilled hole by a 0.13-mm silver wire from a silver baffle with a 35% open area and placed in the lower half of a 0.5 inch diameter silver capsule. 0.10 g of NH$_4$F mineralizer and 0.98 g of polycrystalline GaN source material were placed in the upper half of the capsule. The capsule was then enclosed within a filler/sealing assembly together with a 0.583 inch diameter steel ring. The capsule and filler/sealing assembly were transferred to the gas manifold and filled with 1.07 g of ammonia. Next, the plug was inserted into the open top end of the capsule, such that a cold weld was formed between the silver capsule and silver plug and the steel ring surrounded the plug and provided reinforcement. The capsule was then removed from the filler/sealing assembly and inserted in a zero stroke HPHT apparatus. The cell was heated at about 11° C./min until the temperature of the bottom of the capsule was approximately 700° C. and the temperature of the top half of the capsule was approximately 648° C., as measured by type K thermocouples. The current through the top half of the heater was then increased until the temperature gradient ΔT decreased to 3° C. After holding at ΔT=3° C. for 1 hour, the temperature of the top half of the capsule was decreased at 5° C./hr until ΔT increased to approximately 30° C., then decreased further at 2.5° C./hr until ΔT increased to approximately 60° C. and the temperatures were held at these values for 20 hr. The cell was then cooled and removed from the press. Upon opening the capsule after venting of the ammonia, the seed had grown to a weight of 40.2 mg. The crystal was then etched in 50% HNO$_3$ for 30 min. A row of etch pits was observed on the c-face above the interface between the seed and new, laterally-grown material. However, the remaining areas of newly-grown GaN were free of etch pits. The area of pit-free newly grown GaN was approximately 6.9×10$^{-2}$ cm$^2$, indicating that the etch pit density was less than (1/6.9×10$^{-2}$ cm$^2$) or 14 cm$^{-2}$.

Example 5

A GaN seed weighing 13.5 mg, grown by HVPE, was hung through a laser-drilled hole by a 0.13-mm silver wire from a silver baffle with a 35% open area and placed in the lower half of a 0.5 inch diameter silver capsule. 0.10 g of NH$_4$F mineralizer, 0.031 g of CoF$_2$, and 0.304 g of polycrystalline GaN source material were placed in the upper half of the capsule. The capsule was then enclosed within a filler/sealing assembly together with a 0.583 inch diameter steel ring. The capsule and filler/sealing assembly were transferred to the gas manifold and filled with 1.01 g of ammonia. Next, the plug was inserted into the open top end of the capsule, such that a cold weld was formed between the silver capsule and silver plug and the steel ring surrounded the plug and provided reinforcement. The capsule was then removed from the filler/sealing assembly and inserted in a zero stroke HPHT apparatus. The cell was heated at about 11° C./min until the temperature of the bottom of the capsule was approximately 700° C. and the temperature of the top half of the capsule was approximately 635° C., as measured by type K thermocouples, and the temperatures were held at these values for 10 hr. The cell was then cooled and removed from the press. Upon opening the capsule after venting of the ammonia, the seed weight was 10.3 mg, but had become thicker (0.7 mm thick) and was essentially black; i.e., considerably darker in color than nominally undoped crystals. Seed crystals used with NH$_4$F as a mineralizer typically undergo etching before the onset of crystal growth. After washing, the Co-doped GaN crystal was sandwiched between two pieces of In foil which had been wet with a liquid Ga—In alloy with an electrode area of approximately 0.02 cm$^2$. The electrical resistance across the crystal was found to be approximately 1,050 MΩ at room temperature, corresponding to a resistivity of about 3×10$^8$ Ω-cm. GaN with a resistivity greater than about 10$^5$ Ω-cm is considered to be semi-insulating. The crystal was placed in a photoluminescence apparatus and illuminated with a 266-nm nitrogen laser. No photoluminescence was observable. The ratio of the intensity of near-band-edge photoluminescence from the black GaN crystal to that of a near-transparent, nominally undoped GaN crystal was less than 0.1%.

Example 6

A GaN seed grown by HVPE was hung through a laser-drilled hole by a 0.13-mm silver wire from a silver baffle with a 10% open area and placed in the lower half of a 0.5 inch diameter silver capsule. 0.10 g of NH$_4$F mineralizer, 0.087 g of Fe$_x$N and 0.305 g of polycrystalline GaN source material were placed in the upper half of the capsule. The capsule was then enclosed within a filler/sealing assembly together with a 0.583 inch diameter steel ring. The capsule and filler/sealing assembly were transferred to the gas manifold and filled with 1.12 g of ammonia. Next, the plug was inserted into the open top end of the capsule, such that a cold weld was formed between the silver capsule and silver plug and the steel ring surrounded the plug and provided reinforcement. The capsule was then removed from the filler/sealing assembly and inserted in a zero stroke HPHT apparatus. The cell was heated at about 11° C./min until the temperature of the bottom of the capsule was approximately 700° C. and the temperature of the top half of the capsule was approximately 630° C., as measured by type K thermocouples, and the temperatures were held at these values for 10 hr. The cell was then cooled and removed from the press. Upon opening the capsule after venting of the ammonia, the seed had grown to a thickness of 170 μm and had a reddish/amber color. After washing, the Fe-doped GaN crystal was sandwiched between two pieces of In foil which had been wet with a liquid Ga—In alloy with an electrode area of approximately 0.02 cm$^2$. The electrical resistance was over 32 MΩ at room temperature, corresponding to a resistivity of over $3\times10^7$ Ω-cm. GaN with a resistivity greater than about $10^5$ Ω-cm is considered to be semi-insulating.

Example 7

A GaN seed weighing 14.3 mg, grown by HVPE, was hung through a laser-drilled hole by a 0.13-mm silver wire from a silver baffle with a 35% open area and placed in the lower half of a 0.5 inch diameter silver capsule. 0.10 g of $NH_4F$ mineralizer, 0.026 g of $Mn_xN$ and 1.008 g of polycrystalline GaN source material were placed in the upper half of the capsule. The capsule was then enclosed within a filler/sealing assembly together with a 0.583 inch diameter steel ring. The capsule and filler/sealing assembly were transferred to the gas manifold and filled with 1.04 g of ammonia. Next, the plug was inserted into the open top end of the capsule, such that a cold weld was formed between the silver capsule and silver plug and the steel ring surrounded the plug and provided reinforcement. The capsule was then removed from the filler/sealing assembly and inserted in a zero stroke HPHT apparatus. The cell was heated at about 11° C./min until the temperature of the bottom of the capsule was approximately 700° C. and the temperature of the top half of the capsule was approximately 650° C., as measured by type K thermocouples, and the temperatures were held at these values for 60 hr. The cell was then cooled and removed from the press. Upon opening the capsule after venting of the ammonia, the seed had grown to a weight of 53.4 mg and was 350 μm thick and showed an orange color. Susceptibility measurements demonstrated that the Mn-doped GaN crystals were paramagnetic.

Example 8

0.100 g, 0.200 g, or 0.500 g of $NH_4F$ was added to three separate 0.5 inch silver capsules. Also added to each capsule were 0.36 g of polycrystalline GaN and 0.9–1.0 g of $NH_3$, using the filler/sealing assembly. The concentrations of $NH_4F$ mineralizer, expressed as a mole ratio with respect to ammonia, were 5.4%, 9.3%, and 23.7%, respectively, in the three capsules. The sealed capsules were placed in a cell in a zero-stroke high pressure apparatus and heated to 700° C., held at this temperature for 8 hr, then cooled. GaN crystals grew in all three capsules. Also present in each capsule were crystals comprising $GaF_3(NH_3)_2$ and $(NH_4)_3GaF_6$. The weights of the Ga-containing complexes were 0.12 g, 0.25 g, and 0.65 g, respectively, in the three capsules, indicating that the concentration of dissolved Ga-containing species was approximately proportional to the initial mineralizer concentration. The weights of undissolved polycrystalline GaN in the three capsules were 0.29 g, 0.23 g, and 0.03 g, respectively, indicating that higher concentrations of mineralizer enabled more rapid dissolution and transport of GaN.

Example 9

Figure 11:
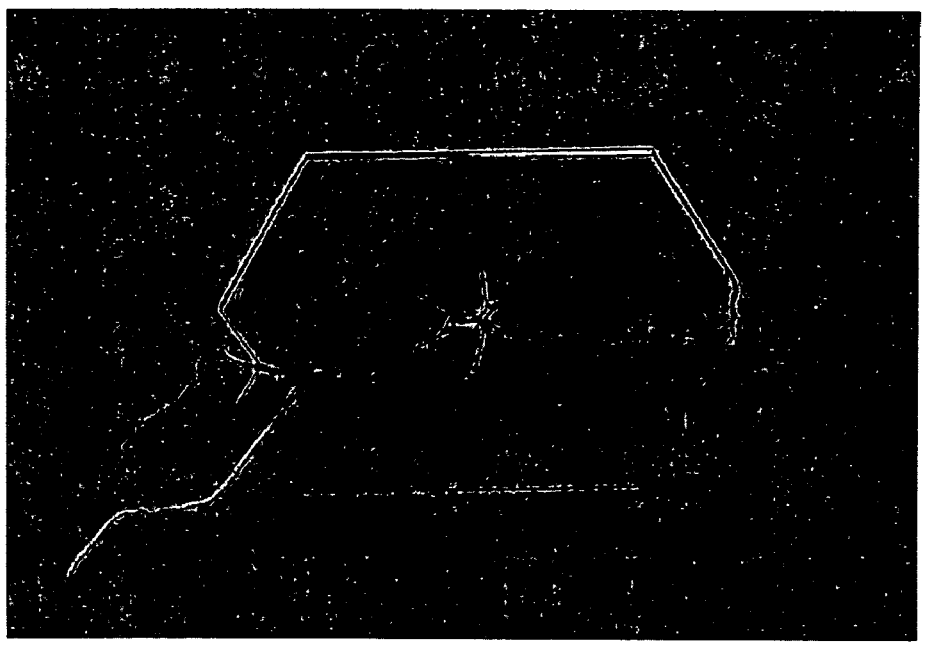
FIG. 11 is a photograph of another GaN crystal grown by the inventive method.
Figure 12:
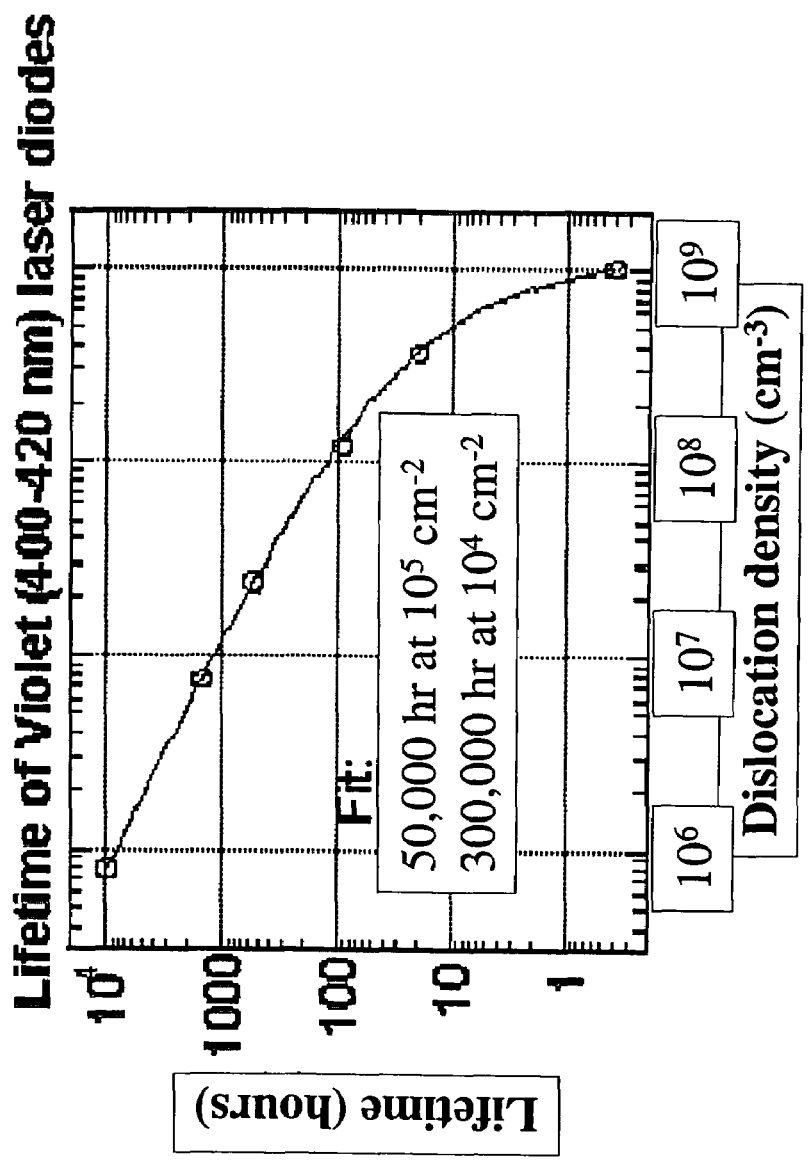
FIG. 12 is a plot showing the dependence of laser diode lifetime on dislocation density.

A hole 2 mm in diameter was laser-cut in the center of a 1-cm square GaN seed crystal. The seed crystal was hung from a 25% open-area baffle and placed inside a 1.1" diameter silver capsule. 1.000 g of $NH_4F$ and 15.276 g of polycrystalline GaN were added to a 1.1" diameter silver capsule inside a glove box, then a lid with a 0.12" diameter fill tube was welded to the top of the capsule. The fill tube was attached to a gas manifold without any air exposure to the contents and the capsule was evacuated, then filled with 8.44 g of $NH_3$. The fill tube was then welded shut. The capsule was placed in a cell in a zero-stroke high pressure apparatus. The cell was heated at about 11° C./min until the temperature of the bottom of the capsule was approximately 700° C. and the temperature of the top half of the capsule was approximately 650° C., as measured by type K thermocouples. The current through the top half of the heater was then increased until the temperature gradient ΔT decreased to zero. After holding at ΔT=0 for 1 hour, the temperature of the top half of the capsule was decreased at 5° C./hr until ΔT increased to approximately 30° C., and the temperatures were held at these values for 100 hr. The cell was then cooled and removed from the press. Upon opening the capsule after venting of the ammonia, the seed was found to have grown laterally to about 11.7×16.0 mm and filled in the hole in the center. The crystal, shown in FIG. 11, comprised essentially dislocation-free material over the hole and at its periphery, although boundaries at the position where laterally-grown GaN coalesced over the seed were visible. The growth rate in the m direction was about 17 μm/hr and the growth rate in the a-direction was about 60 μm/hr, more than enough to fill the hole in the seed with high quality material.

Example 10

Figure 10:
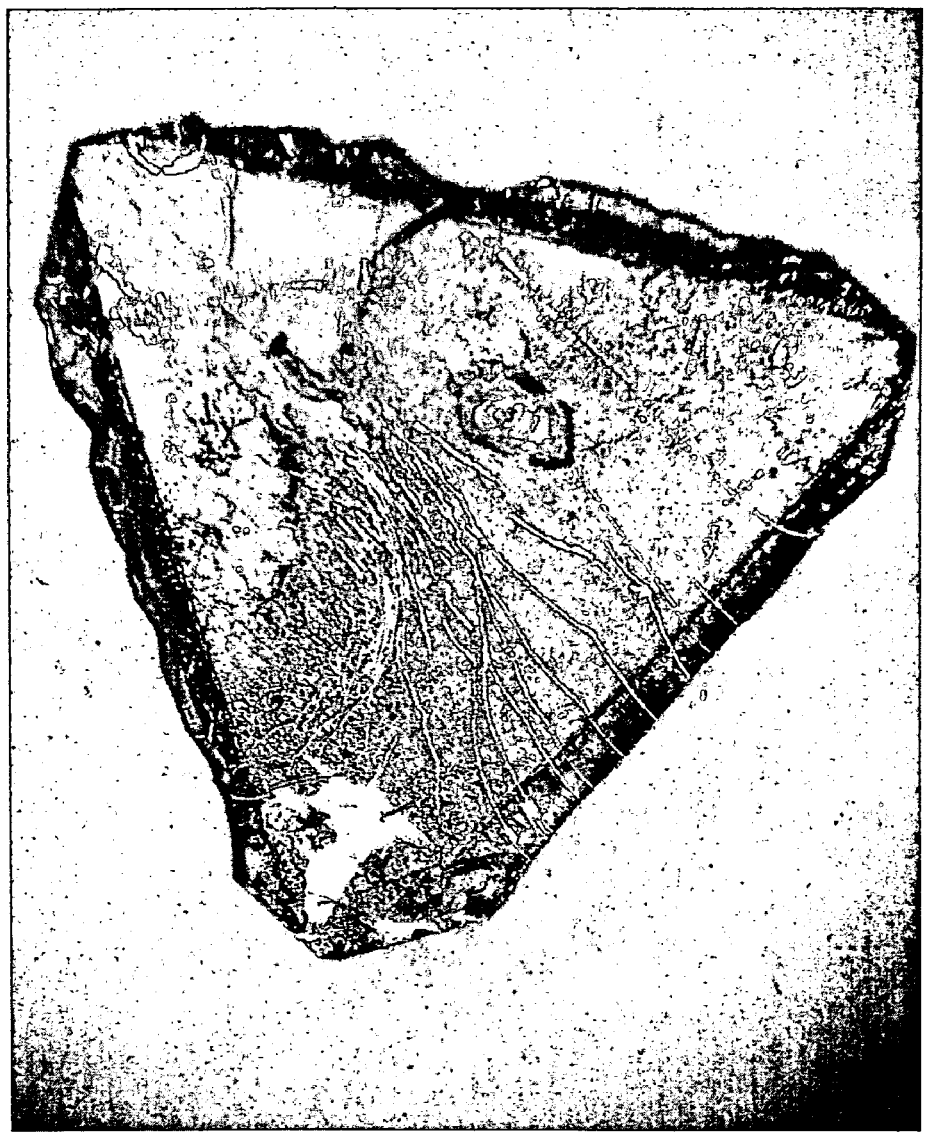
FIG. 10 is a photograph of a GaN crystal grown by the inventive method.

A 18×18×18 mm long triangle shape GaN seed crystal about 0.2 mm thick was hung from a 15% open-area baffle and placed inside a 1.1" diameter silver capsule. 0.998 g of $GaF_3$, 0.125 g of $NH_4F$, and 10.118 g of polycrystalline GaN were added to the capsule inside a glove box, then a lid with a 0.12" diameter fill tube was welded to the top of the capsule. The fill tube was attached to a gas manifold without any air exposure to the contents and the capsule was evacuated, then filled with 9.07 g of $NH_3$. The fill tube was then welded shut. The capsule was placed in a cell in a zero-stroke high pressure apparatus. The cell was heated until the temperature of the bottom of the capsule was approximately 750° C. and the temperature of the top half of the capsule was approximately 700° C., as measured by type K thermocouples. The temperatures were held at these values for 54 hr. The cell was then cooled and removed from the press. Upon opening the capsule after venting of the ammonia, the seed was found to have grown laterally to about 20×20×20 mm. The growth rate lateral to the c axis was approximately 37 μm/hr. The crystal, shown in FIG. 10, comprised essentially dislocation-free material on the edge area. The crystal as grown is very transparent without any visible cracks, boundaries or other defects.

Example 11

A 18×13×0.20 mm thick triangle shape GaN seed crystal was hung from a 25% open-area baffle and placed inside a 1.1" diameter silver capsule. 1.0 g of $NH_4F$ and 14.655 g of polycrystalline GaN were added to the capsule inside a glove box, then a lid with a 0.12" diameter fill tube was welded to the top of the capsule. The fill tube was attached to a gas manifold without any air exposure to the contents and the capsule was evacuated, then filled with 8.35 g of $NH_3$. The fill tube was then welded shut. The capsule was placed in a cell in a zero-stroke high pressure apparatus. The cell was heated until the temperature of the bottom of the capsule was approximately 700° C. and the temperature of the top half of the capsule was approximately 660° C., as measured by type K thermocouples. The temperatures were held at these values for 99 hr. The cell was then cooled and removed from the press. Upon opening the capsule after venting of the ammonia, the lateral dimensions of the seed remained the same, about 18×13 mm. The crystal was wedge shaped, with the thickness ranging from 0.50 mm on the end near the baffle to 2.36 mm on the end near the bottom of the capsule. The growth rate was 5 microns/hr along the C (0001) direction on the thin end and 22 microns/hr on the thick end. The crystal was dark greenish but very transparent without any visible cracks, boundaries, or other defects.

Example 12

A 1×1 $cm^2$ size GaN seed, 880 μm thick, was hung from a 10% open-area baffle and placed inside a 1.1" diameter silver capsule. 1.147 g of $GaF_3$ and 10.112 g of polycrystalline GaN were added to the capsule inside a glove box, then a lid with a 0.12" diameter fill tube was welded to the top of the capsule. The fill tube was attached to a gas manifold without any air exposure to the contents and the capsule was evacuated, then filled with 8.35 g of $NH_3$. The fill tube was then welded shut. The capsule was placed in a cell in a zero-stroke high pressure apparatus. The cell was heated until the temperature of the bottom of the capsule was approximately 750° C. and the temperature of the top half of the capsule was approximately 705° C., as measured by type K thermocouples. The temperatures were held at these values for 56.5 hr. The cell was then cooled and removed from the press. Upon opening the capsule after venting of the ammonia, the seed had increased in thickness to 1520 mm, indicating a growth rate of 11.3 microns/hr growth rate along the c (0001) direction.

Example 13

1.53 g of $NH_4F$ and 1.53 g of polycrystalline GaN were added to a 0.5 inch silver capsule without any $NH_3$. The sealed capsule was placed in a cell in a zero-stroke high pressure apparatus and heated to 700° C., held at this temperature for 13 hr, then cooled. 0.42 of $NH_3$ gas formed by reaction of $NH_4F$ with GaN during the high temperature process was released when the capsule was opened. Well faceted, spontaneously-nucleated GaN crystals were recovered from the bottom of the capsule. An equivalent of about 0.62 g of $NH_4F$ remained (1.53−37/17×0.42), implying-that GaN growth occurred in 40 mole % $NH_4F$.

Example 14

A slot of 1.3×6.1 mm was laser-cut in the center of a 10×16×0.2 mm HVPE GaN crystal. The GaN seed crystal was hung from a 25% open-area baffle and placed inside a 1.1" diameter silver capsule. 1.0 g of $NH_4F$ and 12.79 g of polycrystalline GaN were added to the capsule inside a glove box, then a lid with a 0.12" diameter fill tube was welded to the top of the capsule. The fill tube was attached to a gas manifold without any air exposure to the contents and the capsule was evacuated, then filled with 8.17 g of $NH_3$. The fill tube was then welded shut. The capsule was placed in a cell in a zero-stroke high pressure apparatus. The cell was heated until the temperature of the bottom of the capsule was approximately 700° C. and the temperature of the top half of the capsule was approximately 660° C., as measured by type K thermocouples. The temperatures were held at these values for 94 hr. The cell was then cooled and removed from the press. Upon opening the capsule after venting of the ammonia, the slot was found to be covered over and sealed by newly grown GaN. The slot was very transparent and sealed with high quality new crystal without any visible cracks, boundary or other defects, though a seam/boundary would be expected in the center of the slot.

Example 15

A 1.9 mm×5.1 mm slot was laser-cut in the center of a 8.8 mm×15.1 mm×0.2 mm HVPE GaN crystal. The GaN seed crystal was hung from a 4% open-area baffle and placed inside a 1.1" diameter silver capsule. 1.0 g of $NH_4F$ and 10.03 g of polycrystalline GaN were added to the capsule inside a glove box, then a lid with a 0.12" diameter fill tube was welded to the top of the capsule. The fill tube was attached to a gas manifold without any exposure of the contents to air and the capsule was first evacuated and then filled with 8.54 g of $NH_3$. The fill tube was then welded shut. The capsule was placed in a cell in a zero-stroke high pressure apparatus. The cell was heated until the temperature of the bottom of the capsule was approximately 700° C. and the temperature of the top half of the capsule was approximately 665° C., as measured by type K thermocouples. The temperatures were held at these values for 60 hr. The cell was then cooled and removed from the press. Upon opening the capsule after venting of the ammonia, the slot was found to be substantially covered over by newly grown crystalline GaN, which was very clear and nearly colorless. X-ray diffraction studies were performed on this region. For the (0002) reflection, the intensity vs. to ("rocking curve") measurement yielded a full width at half maximum (FWHM) of 35 arc-seconds. The impurity levels, as determined by calibrated secondary ion mass spectrometry (SIMS), on the Ga surface of the portion of the GaN crystal grown in the slot were found to be: oxygen, $5×10^{17}$ $cm^{−3}$; hydrogen, $3×10^{18}$ $cm^{−3}$; carbon, $4×10^{16}$ $cm^{−3}$; and silicon, $6×10^{15}$ $cm^{−3}$. On the nitrogen surface of the same portion of the GaN crystal the corresponding impurity levels were found to be: oxygen, $4×10^{17}$ $cm^{−3}$; hydrogen, $2×10^{18}$ $cm^{−3}$; carbon, $5×10^{16}$ $cm^{−3}$; and silicon, $2×10^{16}$ $cm^{−3}$.

The improved methods for forming GaN crystal material described above enable the growth of larger high-quality GaN crystals. These improved GaN crystals enable the fabrication of better-performing electronic and optoelectronic devices, with improved efficiency, reliability, yields, high power performance, breakdown voltage, and reduced dark current and defect- and trap-induced noise.

While the invention has been described in detail and with reference to specific embodiments thereof, it will be apparent to one skilled in the art that various changes and modifications can be made therein without departing from the spirit and scope of the invention. Thus, the breadth and scope of the present invention should not be limited by any of the above-described exemplary embodiments, but should be defined only in accordance with the following claims and their equivalents.

This invention claimed is:

1. A GaN crystal comprising up to about 5 mole percent of at least one of aluminum, indium, and combinations thereof, wherein the GaN crystal comprises at least one grain, wherein the at least one grain has a diameter greater than 2 mm, a dislocation density of less than about $10^4$ cm$^{-2}$, and is substantially free of tilt boundaries.

2. The GaN crystal of claim 1, wherein the GaN crystal is grown from one of a single seed and a nucleus.

3. The GaN crystal of claim 1, wherein the GaN crystal is grown on a patterned GaN substrate.

4. The GaN crystal of claim 3, wherein the patterned GaN substrate comprises at least one cutout having a predetermined dimension, and wherein the GaN crystal is grown laterally from a boundary of the at least one cutout.

5. The GaN crystal of claim 4, wherein at least about 50% of the area of a major face of the GaN crystal has a dislocation density of less than about $10^4$ cm$^{-2}$.

6. The GaN crystal of claim 1, wherein the GaN crystal is optically transparent, having an optical absorption coefficient below 100 cm$^{-1}$ at wavelengths between 465 nm and 700 nm.

7. The GaN crystal of claim 6, wherein the optical absorption coefficient is below 5 cm$^{-1}$ at wavelengths between 465 nm and 700 nm.

8. The GaN crystal of claim 1, wherein the GaN crystal has an oxygen concentration of less than about $3 \times 10^{18}$ cm$^{-3}$.

9. The GaN crystal of claim 1, wherein the x-ray rocking curve full width at half maximum of the (0002) reflection in the w direction of the at least one grain is below about 50 arc-sec.

10. The GaN crystal of claim 1, wherein the GaN crystal is one of an n-type semiconductor, a p-type semiconductor, and a semi-insulator.

11. The GaN crystal of claim 10, wherein the GaN crystal is magnetic.

12. The GaN crystal of claim 10, wherein the GaN crystal is luminescent.

13. The GaN crystal of claim 1, wherein the single crystal has a photoluminescence spectrum peaking at a photon energy of between about 3.38 eV and about 3.41 eV at a crystal temperature of about 300 K.

14. The GaN crystal of claim 1, wherein the GaN crystal is a wafer.

15. The GaN crystal of claim 14, wherein the GaN crystal has a rounded edge having a rounded portion.

16. The GaN crystal of claim 14, wherein the wafer has a crystallographic orientation that is within about 10° of one of an (0001) orientation, an (000$\bar{1}$) orientation, an (10$\bar{1}$0) orientation, an (11$\bar{2}$0) orientation, and an (10$\bar{1}$1) orientation.

17. The GaN crystal of claim 16, wherein the crystallographic orientation is within about 5° of one of the (0001) orientation, the (000$\bar{1}$) orientation, the (10$\bar{1}$0) orientation, the (11$\bar{2}$0) orientation, and the (10$\bar{1}$1) orientation.

18. The GaN crystal of claim 17, wherein the crystallographic orientation is one of the (0001) orientation, the (100$\bar{1}$) orientation, the (10$\bar{1}$0) orientation, the (11$\bar{2}$0) orientation, and the (10$\bar{1}$1) orientation.

19. The GaN crystal of claim 14, wherein the GaN crystal has at least one chamfer on an edge of the GaN crystal.

20. The GaN crystal of claim 19, wherein the at least one chamfer has a depth that is between about 10 μm and 20% of a thickness dimension of the wafer and a width that is between about one and about five times the depth.

21. The GaN crystal of claim 1, wherein the GaN crystal is a one of a boule or an ingot.

22. The GaN crystal of claim 1, wherein the dislocation density is less than about $10^3$ cm$^{-2}$.

23. The GaN crystal of claim 22, wherein the dislocation density is less than about 100 cm$^{-2}$.

24. The GaN crystal of claim 1, further comprising at least one dopant, wherein the at least one dopant is one of Be, C, O, Mg, Si, H, Ca, Sc, Ti, V, Cr, Mn, Fe, Co, Ni, Cu, Zn, Ge, Zr, Hf, a rare earth metal, and combinations thereof.

25. The GaN crystal of claim 24, wherein the at least one dopant is present in a concentration in a range from about $10^{16}$ cm-3 to about $10^{21}$ cm$^{-3}$.

26. The GaN crystal of claim 1, wherein the GaN crystal is a single crystal.

27. The GaN crystal of claim 1, wherein the GaN crystal is a black GaN crystal.

28. The GaN crystal of claim 27, wherein a ratio of intensity of near-band-edge photoluminescence from the black GaN crystal to that of a GaN crystal that is substantially transparent and substantially undoped is less than about 0.1%.

29. The GaN crystal of claim 1, wherein the GaN crystal comprises at least 0.04 ppm fluorine.

30. The GaN crystal of claim 1, wherein the at least one grain has a diameter in a range from about 5 mm to about 600 mm.

31. A semiconductor structure, the semiconductor structure comprising: a substrate, wherein the substrate comprises a GaN crystal comprising up to about 5 mole % of at least one of aluminum, indium, and combinations thereof, wherein the GaN crystal comprises at least one grain, wherein the at least one grain has a diameter of at least about 2 mm, a dislocation density of less than about $10^4$ cm$^{-2}$, and is substantially free of tilt boundaries.

32. The semiconductor structure of claim 31, further comprising at least one homoepitaxial layer disposed on the GaN crystal, the at least one layer comprising $Al_xIn_yGa_{1-x-y}N$ layer, where $0 \leq x \leq 1$, $0 \leq y \leq 1$ and $0 \leq x+y \leq 1$, wherein the at least one homoepitaxial layer comprises at least one grain, wherein the at least one grain has a diameter of at least about 2 mm and a dislocation density of less than about $10^4$ cm$^{-2}$, and is substantially free of tilt boundaries.

33. The semiconductor structure of claim 31, wherein the GaN crystal is a wafer.

34. The semiconductor structure of claim 31, wherein the GaN crystal is one of a boule or an ingot.

35. The semiconductor structure of claim 31, wherein the semiconductor structure forms a portion of one of a light emitting diode, a laser diode, a photodetector, an avalanche photodiode, a transistor, a rectifier, and a thyristor; one of a transistor, a rectifier, a Schottky rectifier, a thyristor, a p-i-n diode, a metal-semiconductor-metal diode, high-electron mobility transistor, a metal semiconductor field effect transistor, a metal oxide field effect transistor, a power metal oxide semiconductor field effect transistor, a power metal insulator semiconductor field effect transistor, a bipolar junction transistor, a metal insulator field effect transistor, a heterojunction bipolar transistor, a power insulated gate bipolar transistor, a power vertical junction field effect transistor, a cascade switch, an inner sub-band emitter, a quantum well infrared photodetector, a quantum dot infrared photodetector, and combinations thereof.

36. A GaN crystal comprising up to about 5 mole % of at least one of aluminum, indium, and combinations thereof, wherein the GaN crystal has an infrared absorption peak at about 3175 cm$^{-1}$, with an absorbance per unit thickness of greater than about 0.01 cm$^{-1}$.

37. The GaN crystal of claim 36, wherein the GaN single crystal has a fluorine concentration of greater than about 0.04 ppm.

38. The GaN crystal of claim 36, wherein the GaN crystal forms a portion of a substrate of a semiconductor device, the semiconductor device comprising the substrate.

39. The GaN crystal of claim 38, further comprising at least one active layer homoepitaxially disposed on the GaN single crystal, the at least one active layer comprising $Al_xIn_yGa_{1-x-y}N$ layer, where $0 \leq x \leq 1$, $0 \leq y \leq 1$ and $0 \leq x+y \leq 1$.

40. The GaN crystal of claim 39, wherein each of the at least one active layer and the GaN crystal is substantially free of tilt boundaries and has a dislocation density of less than 100 cm$^{-2}$.

* * * * *